United States Patent
Yoon et al.

(10) Patent No.: US 12,167,684 B2
(45) Date of Patent: Dec. 10, 2024

(54) ORGANIC LIGHT-EMITTING DEVICE

(71) Applicant: Samsung Display Co., Ltd., Yongin-si (KR)

(72) Inventors: Seokgyu Yoon, Yongin-si (KR); Hyojeong Kim, Yongin-si (KR); Hyosup Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 794 days.

(21) Appl. No.: 17/250,453

(22) PCT Filed: Nov. 29, 2018

(86) PCT No.: PCT/KR2018/015003
§ 371 (c)(1),
(2) Date: Jan. 22, 2021

(87) PCT Pub. No.: WO2020/022579
PCT Pub. Date: Jan. 30, 2020

(65) Prior Publication Data
US 2021/0143329 A1    May 13, 2021

(30) Foreign Application Priority Data

Jul. 23, 2018    (KR) .................. 10-2018-0085382

(51) Int. Cl.
| | | |
|---|---|---|
| *H10K 85/60* | (2023.01) | |
| *H10K 50/11* | (2023.01) | |
| *H10K 50/15* | (2023.01) | |
| *H10K 50/18* | (2023.01) | |
| *H10K 85/40* | (2023.01) | |
| *H10K 101/00* | (2023.01) | |
| *H10K 101/10* | (2023.01) | |

(52) U.S. Cl.
CPC .......... *H10K 85/633* (2023.02); *H10K 85/40* (2023.02); *H10K 85/615* (2023.02); *H10K 85/654* (2023.02); *H10K 85/6572* (2023.02); *H10K 85/6574* (2023.02); *H10K 85/6576* (2023.02); *H10K 50/11* (2023.02); *H10K 50/15* (2023.02); *H10K 50/18* (2023.02); *H10K 2101/10* (2023.02); *H10K 2101/90* (2023.02)

(58) Field of Classification Search
CPC .... H10K 85/633; H10K 85/40; H10K 85/615; H10K 85/654; H10K 85/6572; H10K 85/6574; H10K 85/6576; H10K 50/11; H10K 50/15; H10K 50/18; H10K 2101/10; H10K 85/631; H10K 2101/30; H10K 85/657; H10K 50/12
See application file for complete search history.

(56) References Cited

U.S. PATENT DOCUMENTS

| | | | |
|---|---|---|---|
| 7,986,090 | B2 | 7/2011 | Pfeiffer et al. |
| 8,803,420 | B2 | 8/2014 | Kawamura et al. |
| 8,993,129 | B2 | 3/2015 | Endo et al. |
| 9,153,788 | B2 | 10/2015 | Adachi et al. |
| 9,312,496 | B2 | 4/2016 | Sawada et al. |
| 9,385,335 | B2 | 7/2016 | Pflumm et al. |
| 10,193,094 | B2 | 1/2019 | Stoessel et al. |
| 10,340,463 | B2 | 7/2019 | Lee et al. |
| 11,133,482 | B2 | 9/2021 | Seo et al. |
| 11,417,865 | B2 * | 8/2022 | Shin ................... H10K 30/865 |
| 2009/0230844 | A1 | 9/2009 | Pfeiffer et al. |
| 2011/0304262 | A1 | 12/2011 | Kwong |
| 2012/0217869 | A1 | 8/2012 | Adachi et al. |
| 2013/0035672 | A1 | 2/2013 | Raksi |
| 2013/0103008 | A1 | 4/2013 | Sramek |
| 2013/0314785 | A1 | 11/2013 | Kang et al. |
| 2014/0138627 | A1 | 5/2014 | Kwong et al. |
| 2014/0145149 | A1 | 5/2014 | Lin et al. |

(Continued)

FOREIGN PATENT DOCUMENTS

| | | | |
|---|---|---|---|
| CN | 102473857 | A | 5/2012 |
| CN | 106716668 | A | 5/2017 |

(Continued)

OTHER PUBLICATIONS

Park, Young Wook, et al. "Enhanced electroluminescence efficiency of phosphorescent organic light-emitting diodes by controlling the triplet energy of the hole-blocking layer." IEEE Electron Device Letters 31.5 (2010): 452-454. (Year: 2010).*

(Continued)

*Primary Examiner* — Dawn L Garrett
(74) *Attorney, Agent, or Firm* — Lewis Roca Rothgerber Christie LLP

(57) ABSTRACT

An organic light-emitting device may include: an anode; a cathode; an organic layer located between the anode and the cathode and including an emission layer; an electron blocking layer located between the anode and the emission layer and in direct contact with the emission layer; and a hole blocking layer located between the cathode and the emission layer and in direct contact with the emission layer. The emission layer may include a host and a dopant, the electron blocking layer may be an electron blocking material, the hole blocking layer may include a hole blocking material, and the host, the dopant, the electron blocking material, and the hole blocking material may each satisfy Equations 1-1 to 1-4:

$T1(EB) \geq T1(H)$    Equation 1-1

$T1(EB) \geq T1(D)$    Equation 1-2

$T1(HB) > T1(H)$    Equation 1-3

$T1(HB) > T1(D)$.    Equation 1-4

18 Claims, 1 Drawing Sheet

(56) References Cited

U.S. PATENT DOCUMENTS

| | | | |
|---|---|---|---|
| 2014/0145151 A1 | 5/2014 | Xia et al. | |
| 2014/0158992 A1 | 6/2014 | Xia et al. | |
| 2014/0179585 A1 | 6/2014 | Souter et al. | |
| 2014/0312338 A1* | 10/2014 | Mizutani | H10K 50/17 544/215 |
| 2014/0332758 A1 | 11/2014 | Kwong et al. | |
| 2015/0021555 A1 | 1/2015 | Kowng et al. | |
| 2015/0218191 A1 | 8/2015 | Sannomiya et al. | |
| 2015/0295197 A1* | 10/2015 | Adamovich | C07D 213/02 257/40 |
| 2015/0349266 A1 | 12/2015 | Lee et al. | |
| 2016/0087218 A1 | 3/2016 | Kim et al. | |
| 2016/0093809 A1 | 3/2016 | Ikari et al. | |
| 2016/0093812 A1 | 3/2016 | Stoessel et al. | |
| 2016/0093823 A1 | 3/2016 | Seo et al. | |
| 2016/0197286 A1 | 7/2016 | Kawamura et al. | |
| 2016/0380223 A1 | 12/2016 | Nonaka et al. | |
| 2017/0069864 A1 | 3/2017 | Lee et al. | |
| 2017/0373254 A1 | 12/2017 | Lee et al. | |
| 2018/0123049 A1 | 5/2018 | Lee et al. | |
| 2019/0067614 A1 | 2/2019 | Nonaka et al. | |

FOREIGN PATENT DOCUMENTS

| | | |
|---|---|---|
| EP | 2554625 A1 | 2/2013 |
| EP | 3275968 A1 | 1/2018 |
| EP | 3081104 A1 | 4/2020 |
| JP | 2011-140046 | 7/2011 |
| JP | WO2012/050003 A1 | 4/2012 |
| JP | WO2012/073888 A1 | 6/2012 |
| JP | 2013-034967 A | 2/2013 |
| JP | 2013-524707 A | 6/2013 |
| JP | 5285141 B2 | 6/2013 |
| JP | WO2013/081088 A1 | 6/2013 |
| JP | WO2014/050904 A1 | 4/2014 |
| JP | 2014-512416 A | 5/2014 |
| JP | WO2014/103724 A1 | 7/2014 |
| JP | 2014-518737 A | 8/2014 |
| JP | 2014-525803 A | 10/2014 |
| JP | 2014-232861 A | 12/2014 |
| JP | 2015-500308 A | 1/2015 |
| JP | 2015-504322 A | 2/2015 |
| JP | 2015-508569 A | 3/2015 |
| JP | 2015-095814 A | 5/2015 |
| JP | 2015-148588 A | 8/2015 |
| JP | 2015-525248 A | 9/2015 |
| JP | 2015-527231 A | 9/2015 |
| JP | 2015218136 A | 12/2015 |
| JP | 2016-506442 A | 3/2016 |
| JP | 2016072632 A | 5/2016 |
| JP | 2016524333 A | 8/2016 |
| JP | 2016-538300 A | 12/2016 |
| JP | 2016-538393 A | 12/2016 |
| JP | 2016-538426 A | 12/2016 |
| JP | 2016-538435 A | 12/2016 |
| JP | 6305068 B2 | 4/2018 |
| JP | 2015-531748 A | 11/2018 |
| KR | 10-2012-0092909 A | 8/2012 |
| KR | 10-2012-7017497 | 10/2012 |
| KR | 101311934 B1 | 9/2013 |
| KR | 10-2014-0027218 A | 3/2014 |
| KR | 10-2014-7003327 | 4/2014 |
| KR | 10-2014-0068027 A | 6/2014 |
| KR | 10-2014-0154391 | 5/2015 |
| KR | 10-2015-0139709 A | 12/2015 |
| KR | 10-2015-0140356 A | 12/2015 |
| KR | 10-2015-0143552 A | 12/2015 |
| KR | 10-2016-0008570 A | 1/2016 |
| KR | 10-2017-7005332 | 5/2017 |
| KR | 10-2018-0078637 A | 7/2018 |
| KR | 10-2018-0079109 A | 7/2018 |
| WO | 2011086941 A1 | 7/2011 |
| WO | WO 2012/166801 A1 | 12/2012 |
| WO | WO 2013/087579 A1 | 6/2013 |
| WO | WO 2013/171241 A1 | 11/2013 |
| WO | WO 2013/192131 A1 | 12/2013 |
| WO | WO 2014/023479 A1 | 2/2014 |
| WO | WO 2015/118035 A1 | 8/2014 |
| WO | WO 2015/067970 A1 | 5/2015 |
| WO | WO 2015/078828 A2 | 6/2015 |
| WO | WO 2015/081332 A1 | 6/2015 |
| WO | WO 2015/158692 A1 | 10/2015 |
| WO | WO 2016/091887 A2 | 6/2016 |
| WO | WO 2016/096851 A1 | 6/2016 |

OTHER PUBLICATIONS

International Search Report for corresponding Application No. PCT/KR2018/015003 dated Apr. 19, 2019, 7 pages.
Japanese Office Action issued Aug. 2, 2022, in corresponding JP Patent Application No. 2021-503883 (6 pages).

* cited by examiner

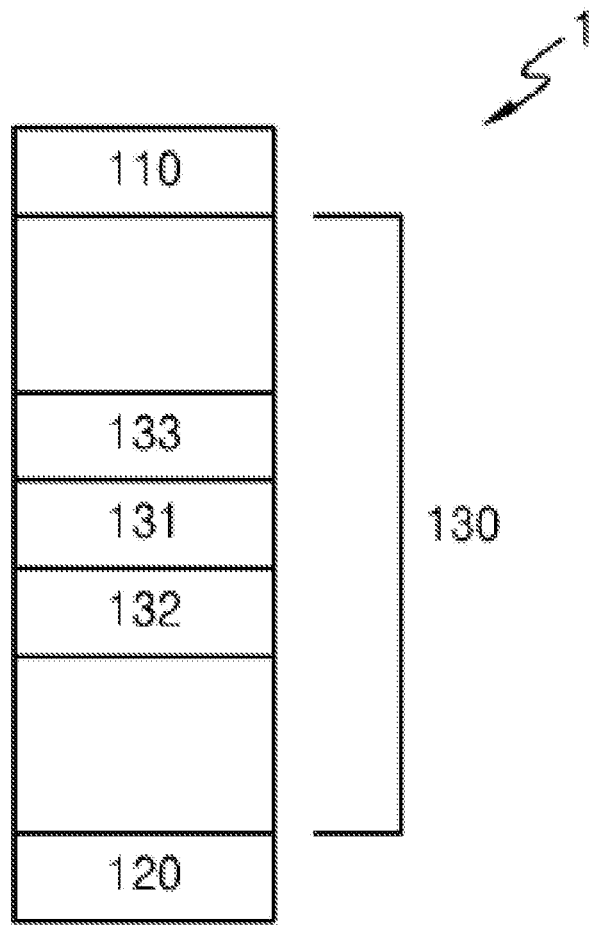

ORGANIC LIGHT-EMITTING DEVICE

CROSS-REFERENCE TO RELATED APPLICATIONS

This application is a U.S. National Phase Patent Application of Korean International Application No. PCT/KR2018/015003 filed Nov. 29, 2018, which claims priority to Korean Patent Application No. 10-2018-0085382 filed on Jul. 23, 2018, the entire content of all of which is incorporated herein by reference.

TECHNICAL FIELD

One or more embodiments relate to an organic light-emitting device.

BACKGROUND ART

Organic light-emitting devices (OLEDs) are self-emissive devices that, as compared with devices of the related art, have wide viewing angles, high contrast ratios, short response times, and excellent characteristics in terms of brightness, driving voltage, and response speed, and produce full-color images.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit from an excited state to a ground state to thereby generate light.

DESCRIPTION OF EMBODIMENTS

Technical Problem

One or more embodiments include an organic light-emitting device including a hole blocking layer and an electron blocking layer.

Technical Solution to Problem

According to an aspect, an organic light-emitting device may include: an anode; a cathode; an organic layer located between the anode and the cathode and including an emission layer;

an electron blocking layer located between the anode and the emission layer and in direct contact with the emission layer; and a hole blocking layer located between the cathode and the emission layer and in direct contact with the emission layer, the emission layer may include a host and a dopant, the electron blocking layer may be an electron blocking material, the hole blocking layer may include a hole blocking material, and the host, the dopant, the electron blocking material, and the hole blocking material may each satisfy Equations 1-1 to 1-4:

$T1(EB) \geq T1(H)$  Equation 1-1

$T1(EB) \geq T1(D)$  Equation 1-2

$T1(HB) > T1(H)$  Equation 1-3

$T1(HB) > T1(D)$  Equation 1-4 wherein, in Equations 1-1 and 1-4,

T1(EB) indicates a lowest excited triplet energy level of the electron blocking material, T1(HB) indicates a lowest excited triplet energy level of the hole blocking material, T1(H) indicates a lowest excited triplet energy level of the host, and T1(D) indicates a lowest excited triplet energy level of the dopant.

According to one or more embodiments, the host, the dopant, the electron blocking material, and the hole blocking material may each satisfy Equations 1-11, 1-21, 1-31, and/or 1-41:

$1.0 \text{ eV} \geq T1(EB) - T1(H) \geq 0.01 \text{ eV}$  Equation 1-11

$1.0 \text{ eV} \geq T1(EB) - T1(D) \geq 0.01 \text{ eV}$  Equation 1-21

$1.0 \text{ eV} \geq T1(HB) - T1(H) \geq 0.01 \text{ eV}$  Equation 1-31

$1.0 \text{ eV} \geq T1(HB) - T1(D) \geq 0.01 \text{ eV}.$  Equation 1-41

In some embodiments, the electron blocking material may include a compound represented by Formula 1:

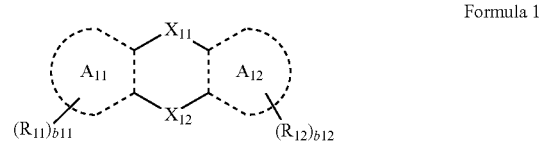

Formula 1 wherein, in Formula 1, $X_{11}$ may be selected from O, S, $N(R_{13})$, and $C(R_{13})(R_{14})$, $X_{12}$ may be selected from a single bond, O, S, $N(R_{15})$, and $C(R_{15})(R_{16})$, $A_{11}$ and $A_{12}$ may each independently be selected from a $C_5$-$C_{60}$ carbocyclic group and a $C_1$-$C_{60}$ heterocyclic group, $R_{11}$ to $R_{16}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), and b11 and b12 may each independently be selected from 1, 2, 3, 4, 5, and 6, wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

In some embodiments, a thickness ($D_E$) of the emission layer ≥a thickness ($D_{EB}$) of the electron blocking layer.

In some embodiments, a thickness of the electron blocking layer may be in a range of about 50 Angstroms (Å) to about 200 Å.

In some embodiments, the hole blocking material may include a compound represented by Formula 2:

$$\text{Formula 2}$$

wherein, in Formula 2, $X_{21}$ may be N or $C(R_{21})$, $X_{22}$ may be N or $C(R_{22})$, $X_{23}$ may be N or $C(R_{23})$, $X_{24}$ may be N or $C(R_{24})$, $X_{25}$ may be N or $C(R_{25})$, and $X_{26}$ may be N or $C(R_{26})$, provided that at least one selected from $X_{21}$ to $X_{26}$ may be N, $R_{21}$ to $R_{26}$ may each independently be selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{21}$ to $R_{26}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, a thickness ($D_E$) of the emission layer ≥a thickness ($D_{HB}$) of the hole blocking layer.

In some embodiments, a thickness of the hole blocking layer may be in a range of about 50 Å to about 200 Å.

In some embodiments, the host may include a compound represented by one of Formulae 1 and 2:

$$\text{Formula 1}$$

$$\text{Formula 2}$$

wherein, in Formulae 1 and 2, $X_{11}$ may be selected from O, S, $N(R_{13})$, and $C(R_{13})(R_{14})$, $X_{12}$ may be selected from a single bond, O, S, $N(R_{15})$, and $C(R_{15})(R_{16})$, $A_{11}$ and $A_{12}$ may each independently be selected from a $C_5$-$C_{60}$ carbocyclic group and a $C_1$-$C_{60}$ heterocyclic group, $R_{11}$ to $R_{16}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —B$(Q_1)(Q_2)$, —N$(Q_1)(Q_2)$, —P$(Q_1)(Q_2)$, —C(=O)$(Q_1)$, —S(=O)$(Q_1)$, —S(=O)$_2$$(Q_1)$, —P(=O)$(Q_1)(Q_2)$, and —P(=S)$(Q_1)(Q_2)$, b11 and b12 may each independently be selected from 1, 2, 3, 4, 5, and 6, wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, $X_{21}$ may be N or $C(R_{21})$, $X_{22}$ may be N or $C(R_{22})$, $X_{23}$ may be N or $C(R_{23})$, $X_{24}$ may be N or $C(R_{24})$, $X_{25}$ may be N or $C(R_{25})$, and $X_{26}$ may be N or $C(R_{26})$, provided that at least one selected from $X_{21}$ to $X_{26}$ may be N, $R_{21}$ to $R_{26}$ may each independently be selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{21}$ to $R_{26}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

According to one or more embodiments, the host may include a first host and a second host.

According to one or more embodiments, the first host may be a hole transporting host not including an electron transporting moiety, and the second host may be an electron transporting host including at least one electron transporting moiety.

In some embodiments, the first host may include the compound represented by Formula 1, and the second host may include the compound represented by Formula 2.

In some embodiments, the first host may be identical to the electron blocking material.

In some embodiments, the second host may be identical to the hole blocking material.

In some embodiments, the dopant may emit delayed fluorescence or fluorescence.

In some embodiments, the dopant may further satisfy Equation 3:

$$|S1(D)-T1(D)| \leq 0.5 \text{ eV}, \qquad \text{Equation 3}$$

wherein, in Equation 3,

T1(D) indicates a lowest excited triplet energy level of the dopant, and

S1(D) indicates a lowest excited singlet energy level of the dopant.

In some embodiments, the dopant may further satisfy Equation 4 and/or Equation 5:

$$2.65 \text{ eV} \leq S1(D) \leq 2.85 \text{ eV} \qquad \text{Equation 4}$$

$$2.65 \text{ eV} \leq T1(D) \leq 3.05 \text{ eV}, \qquad \text{Equation 5}$$

wherein, in Equations 4 and 5,

T1(D) indicates a lowest excited triplet energy level of the dopant, and

S1(D) indicates a lowest excited singlet energy level of the dopant.

In some embodiments, the dopant may be represented by Formula 4:

In some embodiments, the organic layer may include a hole transport layer located between the anode and the electron blocking layer, the hole transport layer may include a hole transporting material, and the host and the hole transporting material may each satisfy Equation 6:

$$T1(H) \geq T1(HT), \qquad \text{Equation 6}$$

wherein, in Equation 6,

T1(H) indicates a lowest excited triplet energy level of the host, and

T1(HT) indicates a lowest excited triplet energy level of the hole transporting material.

In some embodiments, the organic layer may include an electron transport layer located between the cathode and the hole blocking layer, the electron transport layer may include an electron transporting material, and the dopant and the electron transporting material may each satisfy Equation 7:

$$T1(D) \geq T1(ET), \qquad \text{Equation 7}$$

wherein, in Equation 7,

T1(D) indicates a lowest excited triplet energy level of the dopant, and

T1(ET) indicates a lowest excited triplet energy level of the electron transporting material.

Advantageous Effects of Disclosure

An organic light-emitting device including the electron blocking layer and the hole blocking layer may have improved efficiency and lifespan.

BRIEF DESCRIPTION OF DRAWINGS

The drawing illustrates a schematic cross-sectional view of an embodiment of an organic light-emitting device.

MODE OF DISCLOSURE

As the inventive concept allows for various changes and numerous embodiments, particular embodiments will be illustrated in the drawings and described in detail in the written description. Effects, features, and a method of achieving the inventive concept will be obvious by referring to example embodiments of the inventive concept with reference to the attached drawings. The inventive concept may, however, be embodied in many different forms and should not be construed as being limited to the embodiments set forth herein.

Hereinafter, the inventive concept will be described in detail by explaining example embodiments of the inventive concept with reference to the attached drawings. Like reference numerals in the drawings denote like elements, and thus their description will be omitted.

In the embodiments described in the present specification, an expression used in the singular encompasses the expression of the plural, unless it has a clearly different meaning in the context.

In the present specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The "lowest excited triplet energy level" as used herein was measured as follows: a compound was deposited on a quartz substrate to a thickness of 600 Å to prepare a sample. A photoluminescence spectrum of the sample was obtained at a temperature of 4 Kelvins (K), a first peak (a peak having the shortest wavelength) of the photoluminescence spectrum was analyzed to thereby calculate the lowest excited triplet energy level (a T1 energy level).

The term "organic layer" as used herein refers to a single layer and/or a plurality of layers between an anode and a cathode in an organic light-emitting device. A material included in the "organic layer" is not limited to an organic material.

As used herein, the expression the "(organic layer) includes a compound represented by Formula 1" may be construed as meaning the "(organic layer) may include one compound that is represented by Formula 1 or two different compounds that are represented by Formula 1".

The inventive concept will now be described more fully with reference to the accompanying drawings, in which exemplary embodiments of the inventive concept are shown.

The drawing is a schematic view of an organic light-emitting device 1 according to an embodiment.

As shown in the drawing, the organic light-emitting device 1 may include: an anode 110; a cathode 120; an organic layer 130 located between the anode 110 and the cathode 120 and including an emission layer 131; an electron blocking layer 132 located between the anode 110 and the emission layer 131 and in direct contact with the emission layer 131; and a hole blocking layer 133 located between the cathode 120 and the emission layer 131 and in direct contact with the emission layer 131, wherein the emission layer 131 may include a host and a dopant, the electron blocking layer 132 may include an electron blocking material, a hole blocking layer 133 may include a hole blocking material, and the host, the dopant, the electron blocking material, and the hole blocking material may each satisfy Equations 1-1 to 1-4:

$$T1(EB) \geq T1(H) \quad \text{Equation 1-1}$$

$$T1(EB) \geq T1(D) \quad \text{Equation 1-2}$$

$$T1(HB) > T1(H) \quad \text{Equation 1-3}$$

$$T1(HB) > T1(D) \quad \text{Equation 1-4}$$

wherein, in Equations 1-1 and 1-4, $T1(EB)$ indicates a lowest excited triplet energy level of the electron blocking material, $T1(HB)$ indicates a lowest excited triplet energy level of the hole blocking material, $T1(H)$ indicates a lowest excited triplet energy level of the host, and $T1(D)$ indicates a lowest excited triplet energy level of the dopant.

In an organic light-emitting device that satisfies Equations 1-1 and 1-2, a ratio of excitons generated in an emission layer that may not participate in emission and move to a hole transport region may be decreased, thus increasing a triplet concentration in the emission layer. Therefore, the organic light-emitting device may have improved efficiency.

In an organic light-emitting device that satisfies Equations 1-3 and 1-4, excitons generated in the emission layer that may not participate in emission and move to an electron transport region may be substantially prevented, thus increasing a triplet concentration in the emission layer. Therefore, the organic light-emitting device may have improved efficiency.

To achieve the aforementioned effects, the emission layer may be in direct contact with the hole blocking layer and the electron blocking layer, and another layer may not be interposed between the emission layer and the hole blocking layer and between the emission layer and the electron blocking layer.

In particular, the host, the dopant, and the electron blocking material may satisfy $T1(EB) > T1(H)$ and/or $T1(EB) > T1(D)$, but embodiments are not limited thereto. In this embodiment, excitons generated in the emission layer that may not participate in emission and move to a hole transport region may be substantially prevented, thus increasing a triplet concentration in the emission layer. Therefore, the organic light-emitting device may have significantly improved efficiency.

In particular, the host, the dopant, the electron blocking material, and the hole blocking material may each further satisfy Equation 1-11, Equation 1-21, Equation 1-31, and/or Equation 1-41, but embodiments are not limited thereto:

$$1.0 \text{ eV} \geq T1(EB) - T1(H) \geq 0.01 \text{ eV} \quad \text{Equation 1-11}$$

$$1.0 \text{ eV} \geq T1(EB) - T1(D) \geq 0.01 \text{ eV} \quad \text{Equation 1-21}$$

$$1.0 \text{ eV} \geq T1(HB) - T1(H) \geq 0.01 \text{ eV} \quad \text{Equation 1-31}$$

$$1.0 \text{ eV} \geq T1(HB) - T1(D) \geq 0.01 \text{ eV} \quad \text{Equation 1-41}$$

wherein, in Equations 1-11, 1-21, 1-31, and 1-41, $T1(EB)$ indicates a lowest excited triplet energy level of the electron blocking material, $T1(HB)$ indicates a lowest excited triplet energy level of the hole blocking material, $T1(H)$ indicates a lowest excited triplet energy level of the host, and $T1(D)$ indicates a lowest excited triplet energy level of the dopant.

In the organic light-emitting device that further satisfies Equations 1-11 and 1-21, as the ratio of triplets that move from the emission layer to the hole blocking layer to triplets that move from the host to the dopant is properly controlled, efficiency and lifespan thereof may be changed simultaneously. In particular, a ratio of triplets that move to the hole blocking layer may be decreased and efficiency of the organic light-emitting device may be improved.

In the organic light-emitting device that further satisfies Equations 1-31 and 1-41, as the ratio of triplets that move from the emission layer to the electron blocking layer to triplets that move from the host to the dopant is properly controlled, efficiency and lifespan thereof may be changed simultaneously. In particular, a ratio of triplets that move to the electron blocking layer may be decreased and efficiency of the organic light-emitting device may be improved.

The anode 110 may be formed by depositing or sputtering a material for forming the anode 110 on the substrate. The anode 110 may be selected from materials with a high work function for easy hole injection.

The anode 110 may be a reflective electrode, a semi-transmissive electrode, or a transmissive electrode. When forming a transmissive electrode, a material for forming the anode 110 may be selected from indium tin oxide (ITO), indium zinc oxide (IZO), tin oxide ($SnO_2$), zinc oxide (ZnO), and any combinations thereof, but embodiments are not limited thereto. In some embodiments, when forming a semi-transmissive electrode or a reflective electrode, as a material for forming the anode, at least one selected from magnesium (Mg), silver (Ag), aluminum (Al), aluminum-lithium (Al—Li), calcium (Ca), magnesium-indium (Mg—In), magnesium-silver (Mg—Ag), and any combination thereof may be used, but embodiments are not limited thereto.

The anode 110 may have a single-layered structure, or a multi-layered structure including two or more layers. For example, the anode 110 may have a triple-layer structure of ITO/Ag/ITO, but embodiments are not limited thereto.

The organic layer 130 may be on the anode 110. As described, the organic layer 130 may include the emission layer 131 and the first electron blocking layer 132. The organic layer 130 may further include a hole transport region (not shown) between the anode 110 and the emission layer 131 and an electron transport region (not shown) between the emission layer 131 and the cathode 120.

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may further include, in addition to the electron blocking layer 132, at least one of a hole injection layer, a hole transport layer, and an emission auxiliary layer.

For example, the hole transport region may have a single-layered structure including a single layer including a plurality of different materials or a multi-layered structure, e.g., a hole injection layer/hole transport layer/electron blocking layer structure, a hole injection layer/hole transport layer/emission auxiliary layer/electron blocking layer structure, a hole injection layer/emission auxiliary layer/electron blocking layer structure, or a hole transport layer/emission auxiliary layer/electron blocking layer structure, wherein layers of each structure are sequentially stacked on the anode 110 in each stated order, but embodiments are not limited thereto.

The hole transport region may include at least one selected from m-MTDATA, TDATA, 2-TNATA, NPB (NPD), β-NPB, TPD, a spiro-TPD, a spiro-NPB, methylated-NPB, TAPC, FIMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), CzSi, TCTA, a compound represented by Formula 201, and a compound represented by Formula 202:

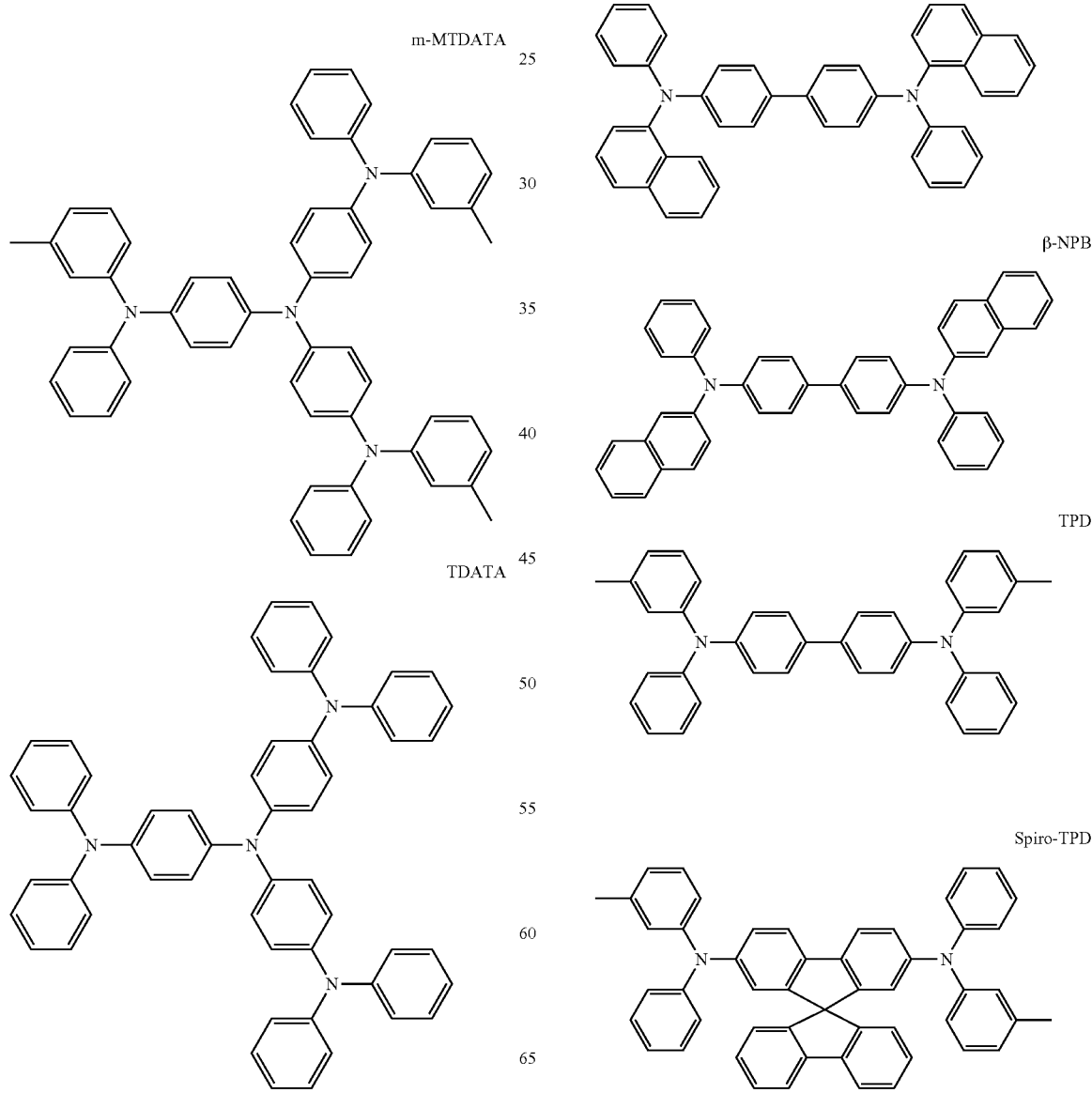

Spiro-NPB

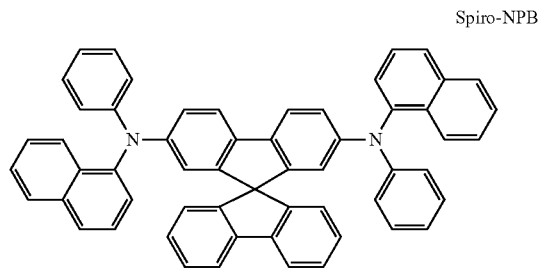

methylated NPB

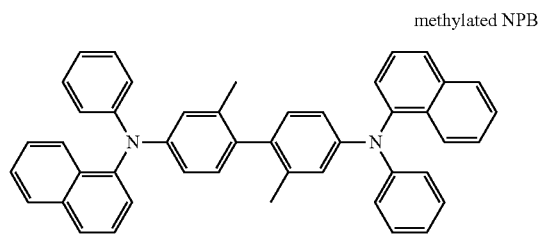

TAPC

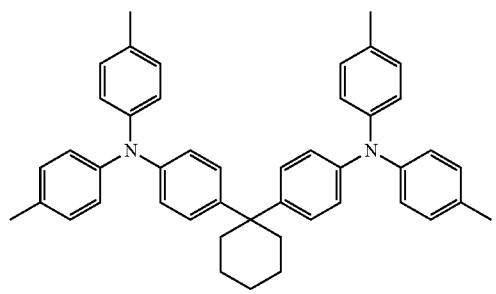

HMTPD

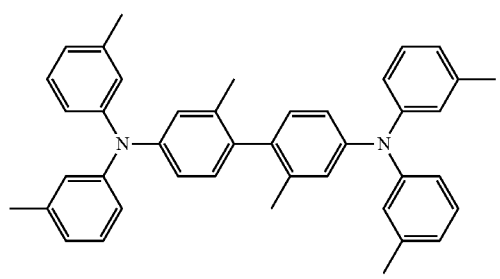

TCTA

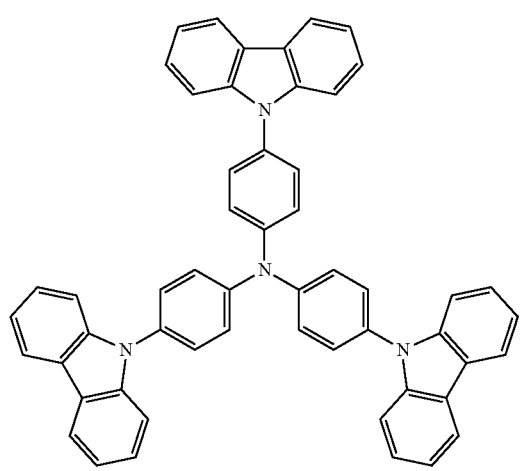

CzSi

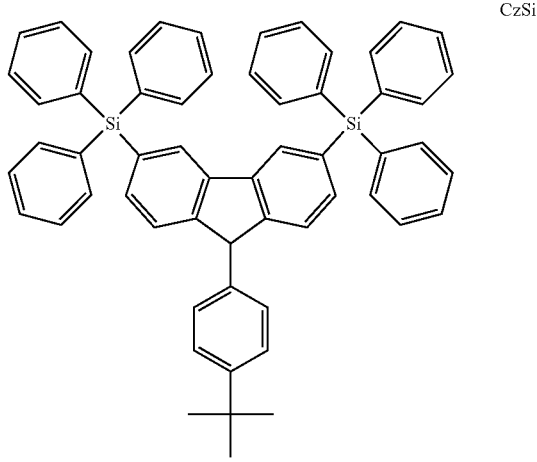

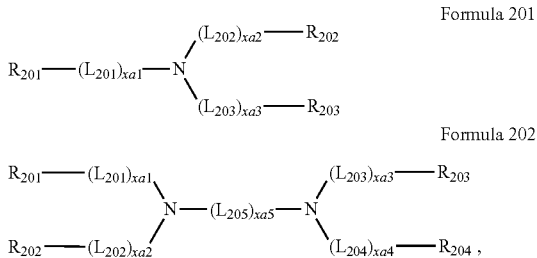

Formula 201

Formula 202 wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formula 202, $R_{201}$ and $R_{202}$ may optionally be bound via a single bond, a dimethyl-methylene group, or a diphenyl-methylene group, and $R_{203}$ and $R_{204}$ may optionally be bound via a single bond, a dimethyl-methylene group, or a diphenyl-methylene group.

In some embodiments, in Formula 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In some embodiments, xa1 to xa4 may each independently be 0, 1, or 2.

In some embodiments, xa5 may be 1, 2, 3, or 4.

In some embodiments, $R_{201}$ to $R_{204}$ and $Q_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may respectively be understood by referring to the descriptions of $Q_{31}$ to $Q_{33}$ provided herein.

In some embodiments, in Formula 201, at least one of $R_{201}$ to $R_{203}$ may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

In some embodiments, in Formula 202, i) $R_{201}$ and $R_{202}$ may be bound via a single bond, and/or ii) $R_{203}$ and $R_{204}$ may be bound via a single bond.

In some embodiments, in Formula 202, at least one of $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments are not limited thereto.

The compound represented by Formula 201 may be represented by Formula Formula 201A:

Formula 201A

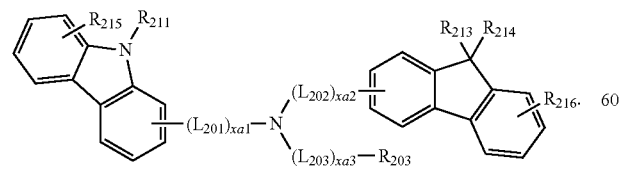

In some embodiments, the compound represented by Formula 201 may be represented by Formula 201A(1), but embodiments are not limited thereto:

Formula 201A(1)

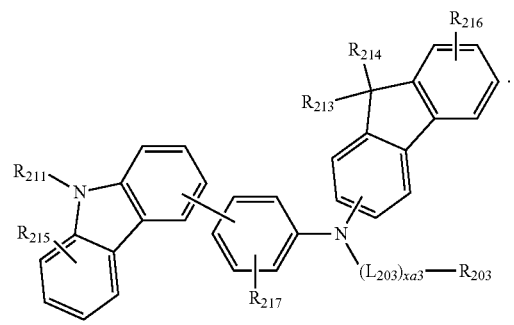

In some embodiments, the compound represented by Formula 201 may be represented by Formula 201A-1, but embodiments are not limited thereto:

Formula 201A-1

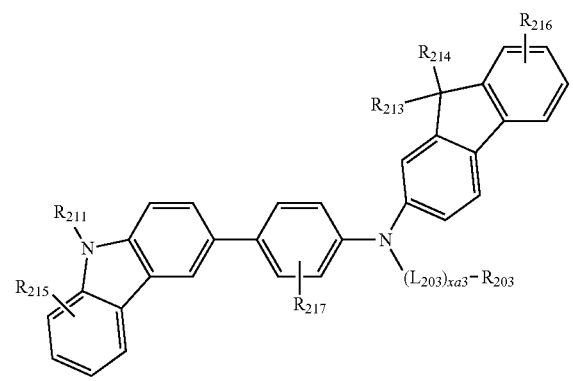

In some embodiments, the compound represented by Formula 202 may be represented by Formula 202A:

Formula 202A

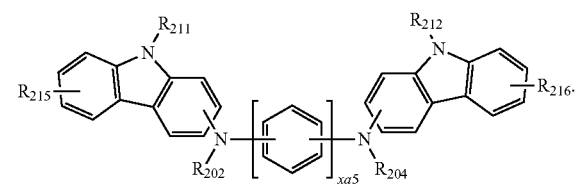

In some embodiments, the compound represented by Formula 202 may be represented by Formula 202A-1:

Formula 202A-1

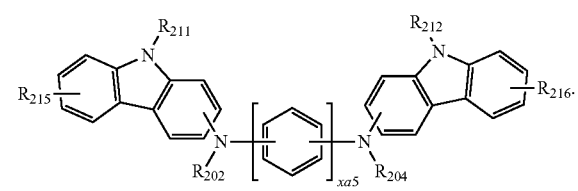

In Formulae 201A, 201A(1), 201A-1, 202A, and 202A-1, $L_{201}$ to $L_{203}$, xa1 to xa3, xa5, and $R_{202}$ to $R_{204}$ may respectively be understood by referring to the descriptions of $L_{201}$ to $L_{203}$, xa1 to xa3, xa5, and $R_{202}$ to $R_{204}$ provided herein, $R_{211}$ and $R_{212}$ may each be understood by referring to the description of $R_{203}$ provided herein, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments are not limited thereto:

HT1

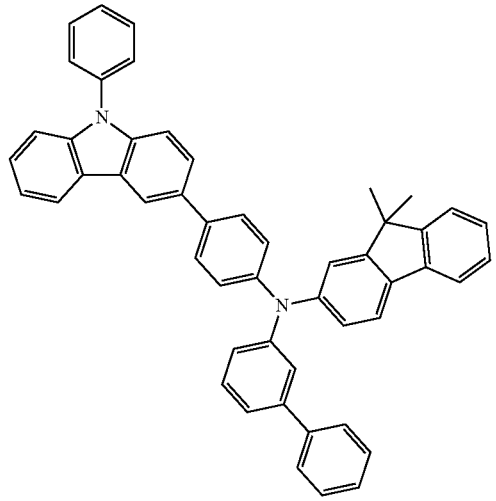

HT2

-continued

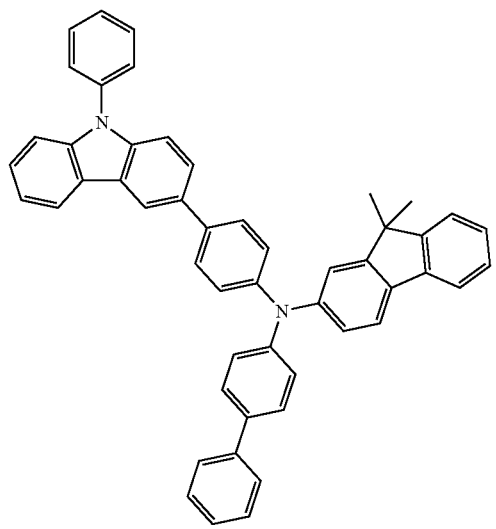

HT3

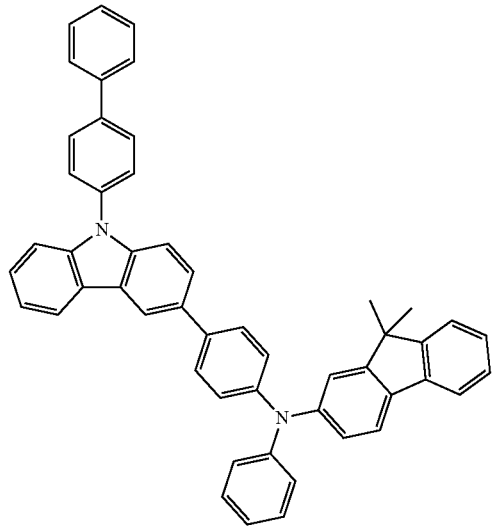

HT4

HT5
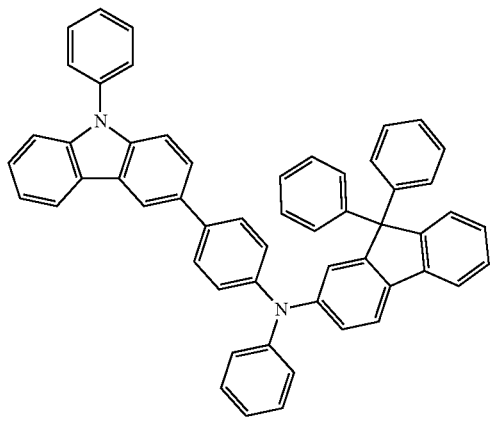
HT6
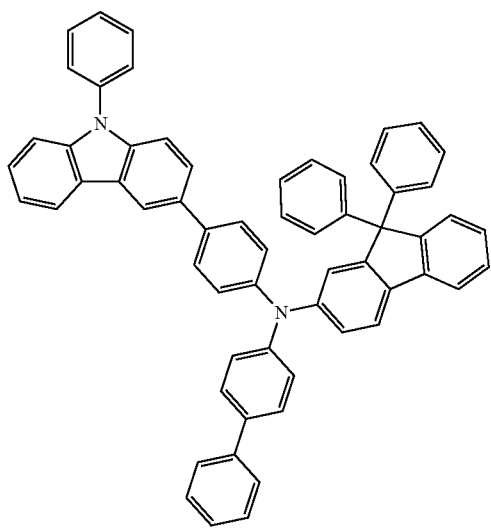
HT7
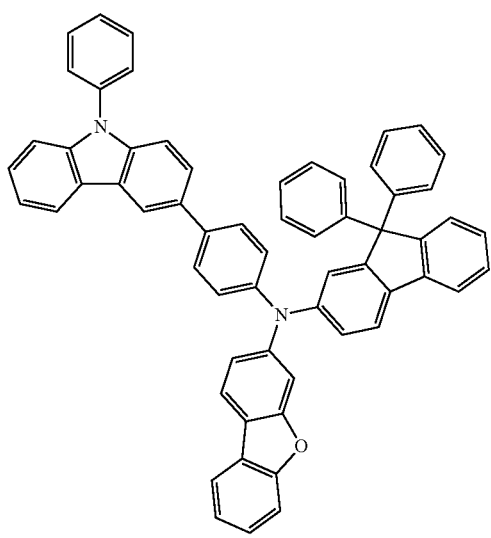
HT8
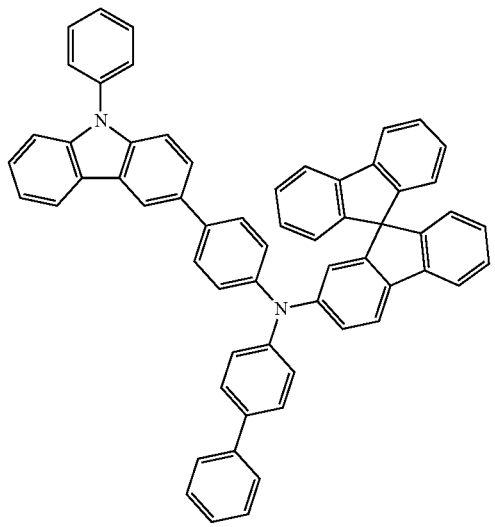
HT9
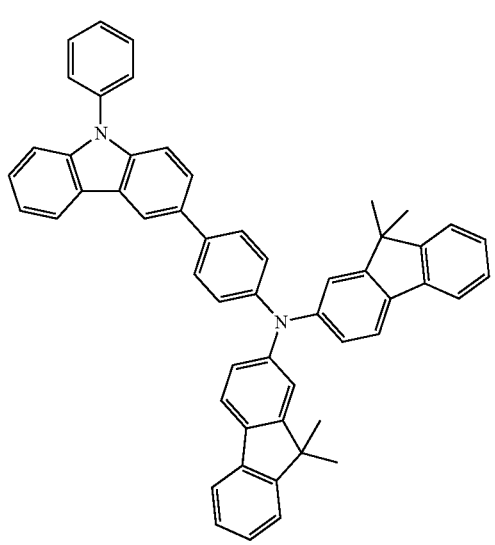
HT10
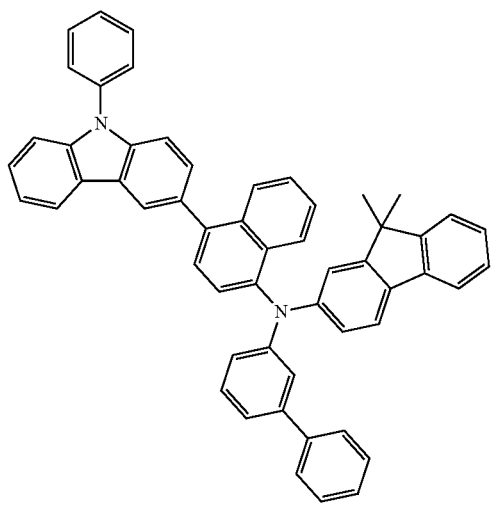

HT11
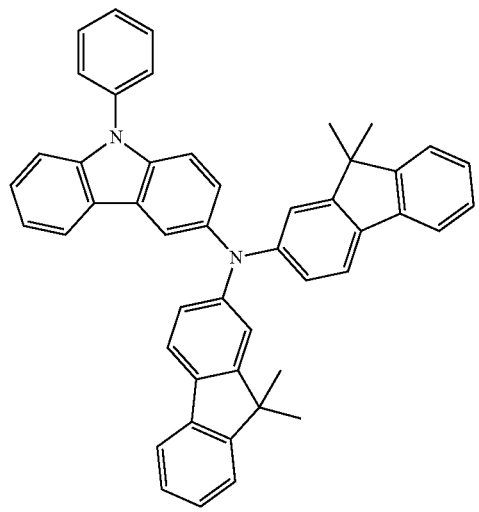
HT12
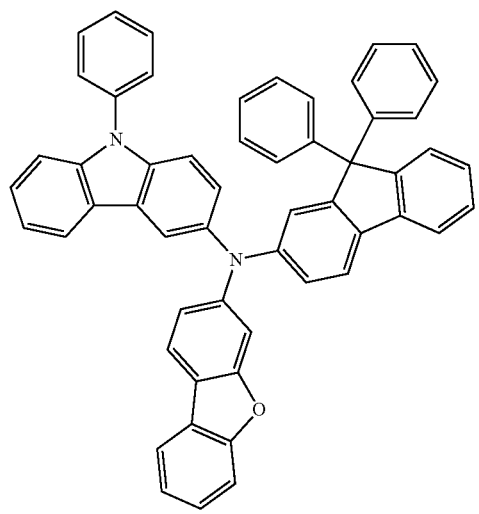
HT13
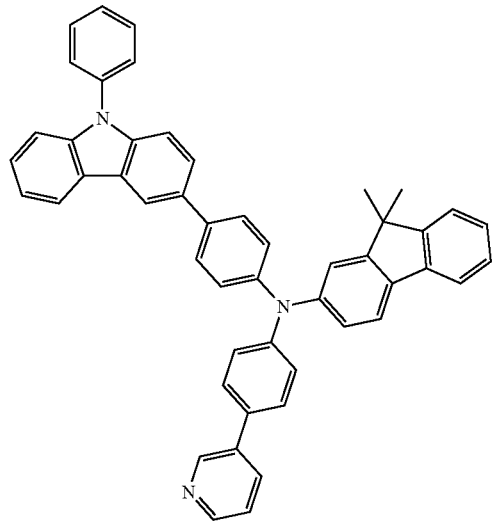
HT14
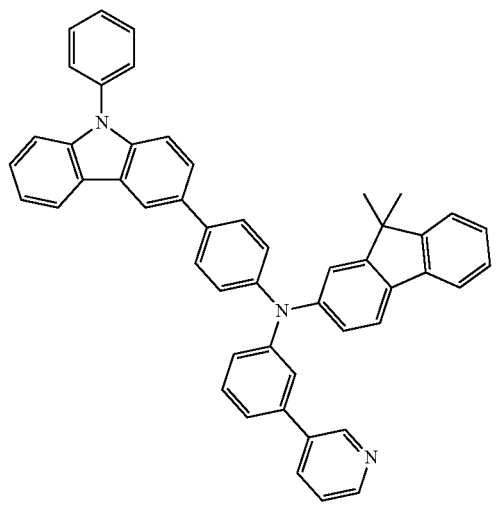
HT15
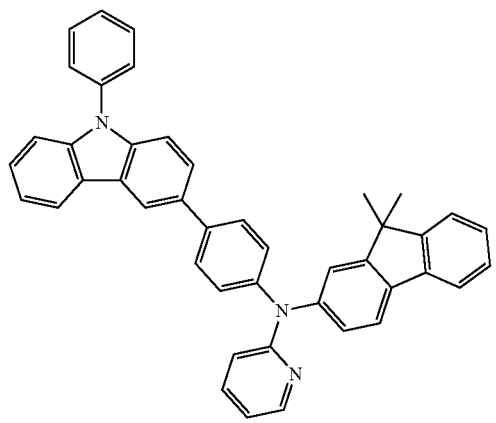
HT16
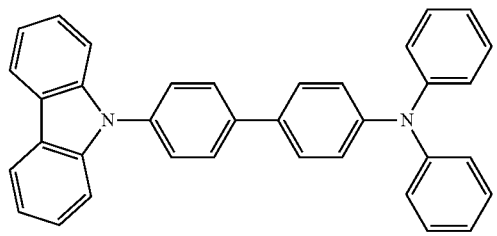
HT17
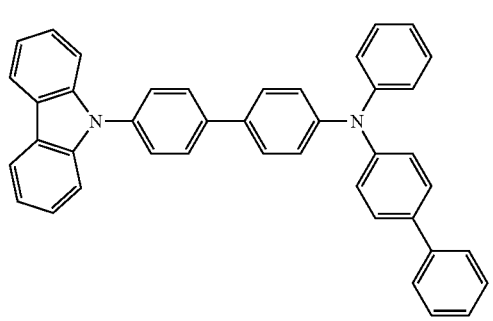

HT18
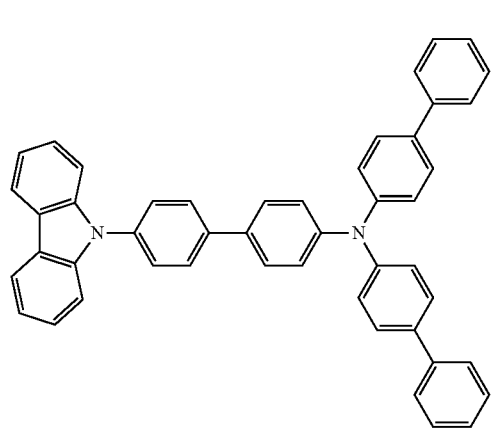
HT19
HT20
HT21
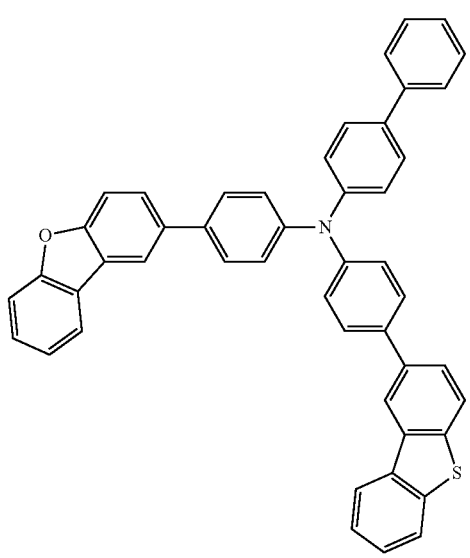
HT22
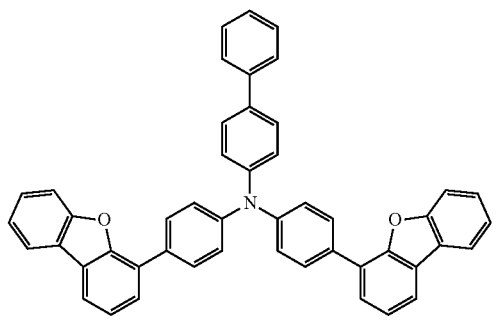
HT23
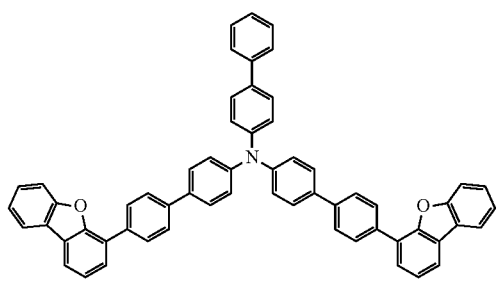
HT24
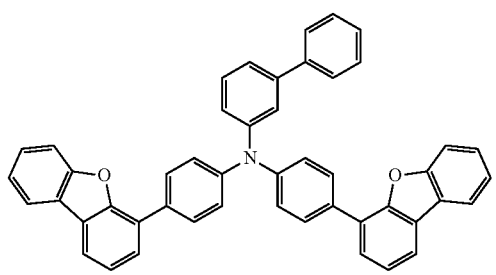

HT25
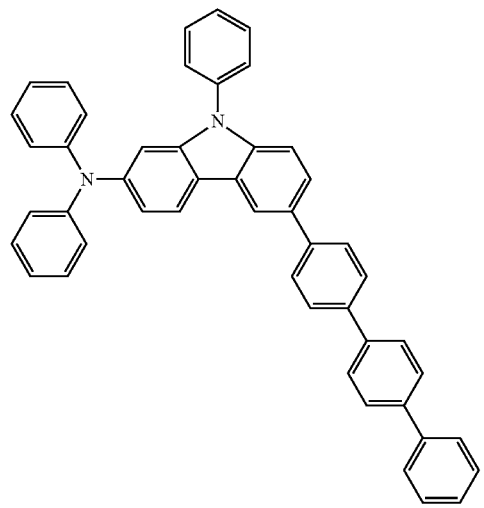
HT26
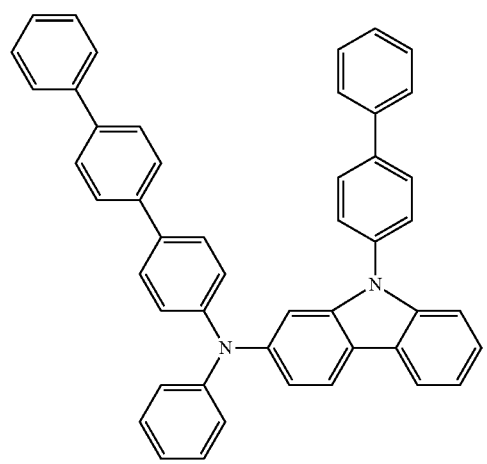
HT27
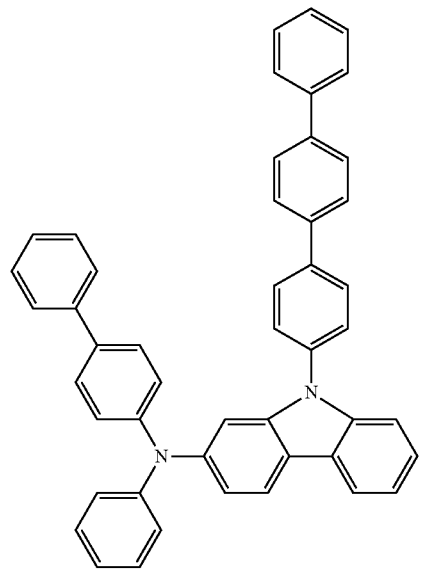
HT28
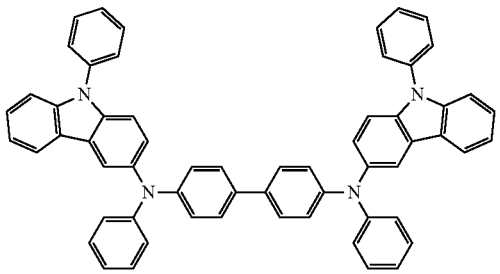
HT29
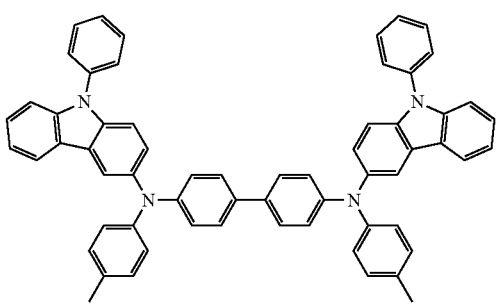
HT30
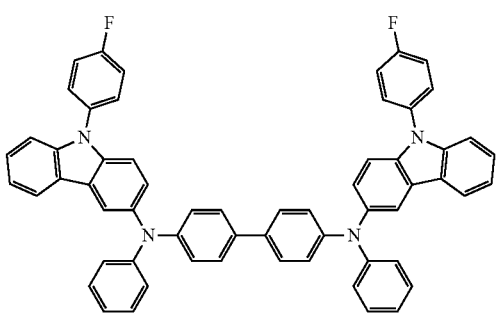
HT31
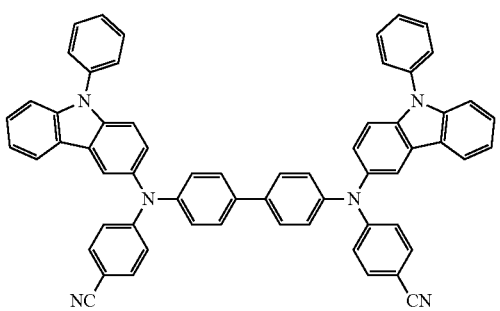
HT32
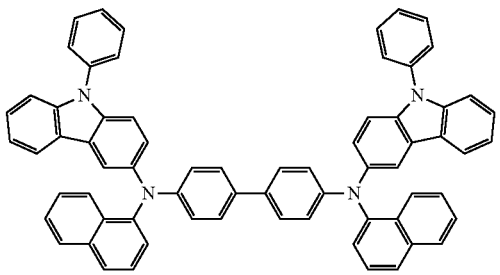

-continued

HT33
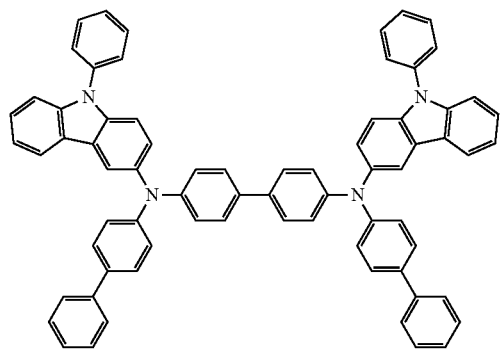

HT34
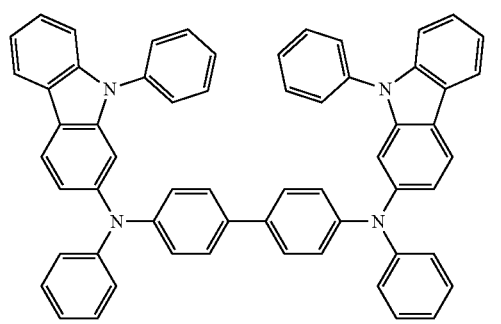

HT35
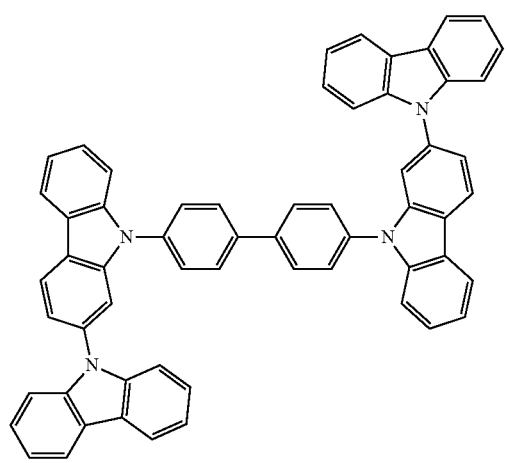

HT36
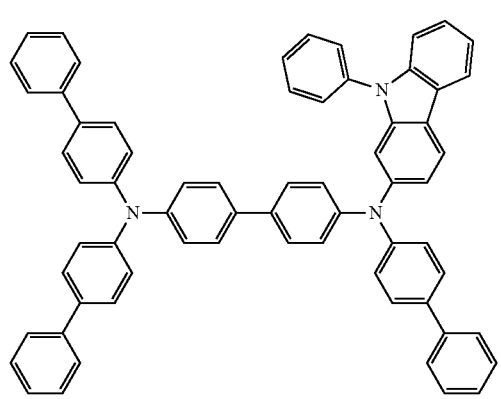

-continued

HT37
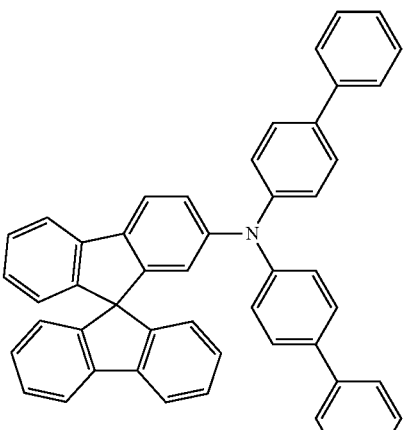

JT38
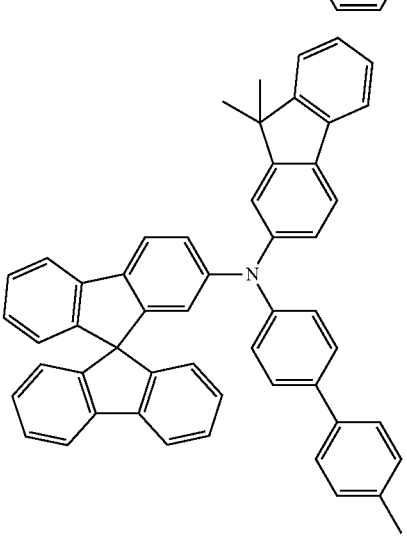

HT39
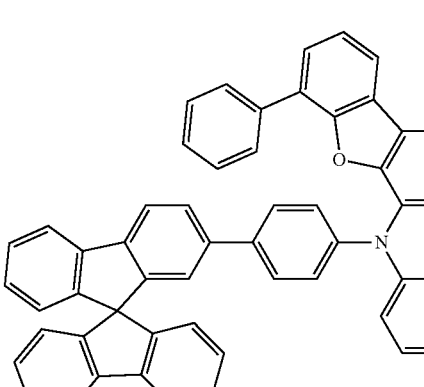

The thickness of the hole transport region may be in a range of about 100 (Angstroms) Å to about 10,000 Å, and in some embodiments, about 100 Å to about 1,000 Å. When the hole transport region includes at least one of a hole injection layer and a hole transport layer, the thickness of the hole injection layer may be in a range of about 100 Å to about 9,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material, as well as the aforementioned materials, to improve conductive properties of the hole transport region. The charge generating material may be substantially homogeneously or non-homogeneously dispersed in the hole transport region.

The charge generating material may include, for example, a p-dopant.

In some embodiments, a lowest unoccupied molecular orbital (LUMO) of the p-dopant may be −3.5 eV or less.

The p-dopant may include at least one selected from a quinone derivative, a metal oxide, and a cyano group-containing compound, but embodiments are not limited thereto.

In some embodiments, the p-dopant may be selected from a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,11-hexaazatriphenylene-hexacarbonitrile (HAT-CN); and a compound represented by Formula 221, but embodiments are not limited thereto:

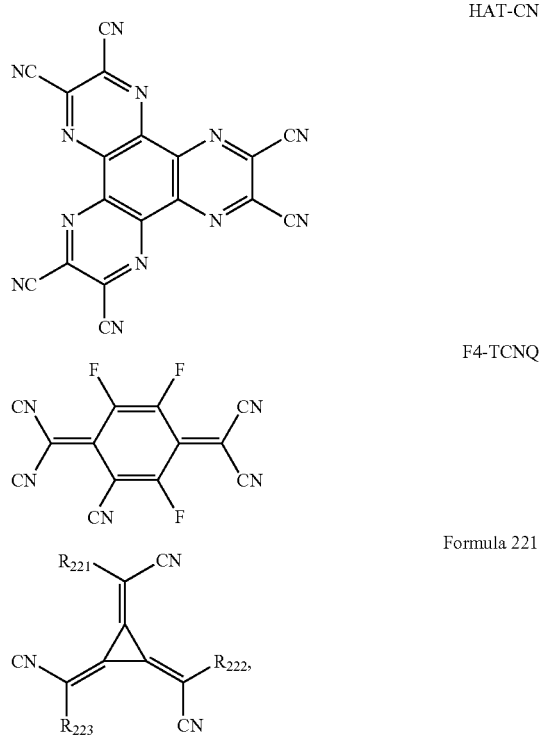

wherein, in Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one of $R_{221}$ to $R_{223}$ may include at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

The electron blocking material may satisfy 2.5 eV≤T1 (EB)≤3.5 eV, but embodiments are not limited thereto. When the range described above is satisfied, excitons may be substantially confined in the emission layer, thus allowing excitons to sufficiently participate in emission.

The electron blocking material may include, e.g., a carbazole-based derivative (such as N-phenylcarbazole or polyvinylcarbazole), a fluorine-based derivative, a triphenylamine-based derivative (such as N,N'-bis(3-methylphenyl)-N, N'-diphenyl-[1,1-biphenyl]-4,4'-diamine (TPD) or 4,4',4''-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), or mCP.

In particular, the electron blocking material may include a compound represented by Formula 1, but embodiments are not limited thereto:

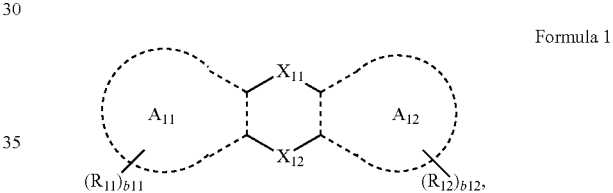

wherein, in Formula 1, $X_{11}$ may be selected from O, S, N($R_{13}$), and C($R_{13}$)($R_{14}$), $X_{12}$ may be selected from a single bond, O, S, N($R_{15}$), and C($R_{15}$)($R_{16}$), $A_{11}$ and $A_{12}$ may each independently be selected from a $C_5$-$C_{60}$ carbocyclic group and a $C_1$-$C_{60}$ heterocyclic group, $R_{11}$ to $R_{16}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b11 and b12 may each independently be selected from 1, 2, 3, 4, 5, and 6, wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

In particular, the electron blocking material may be selected from Compounds 1 to 12, but embodiments are not limited thereto:

1

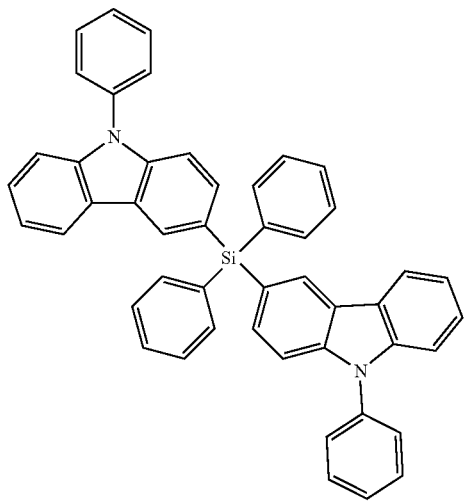

2

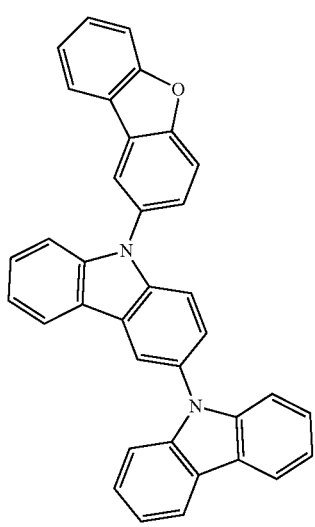

3

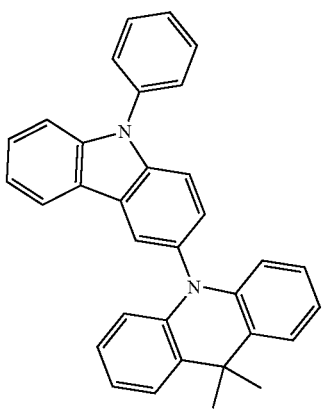

4

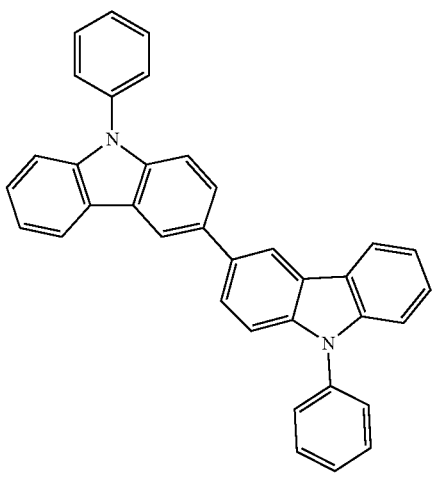

5

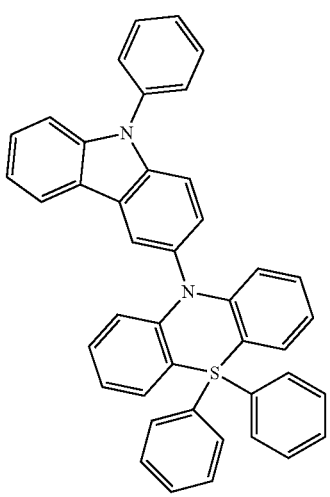

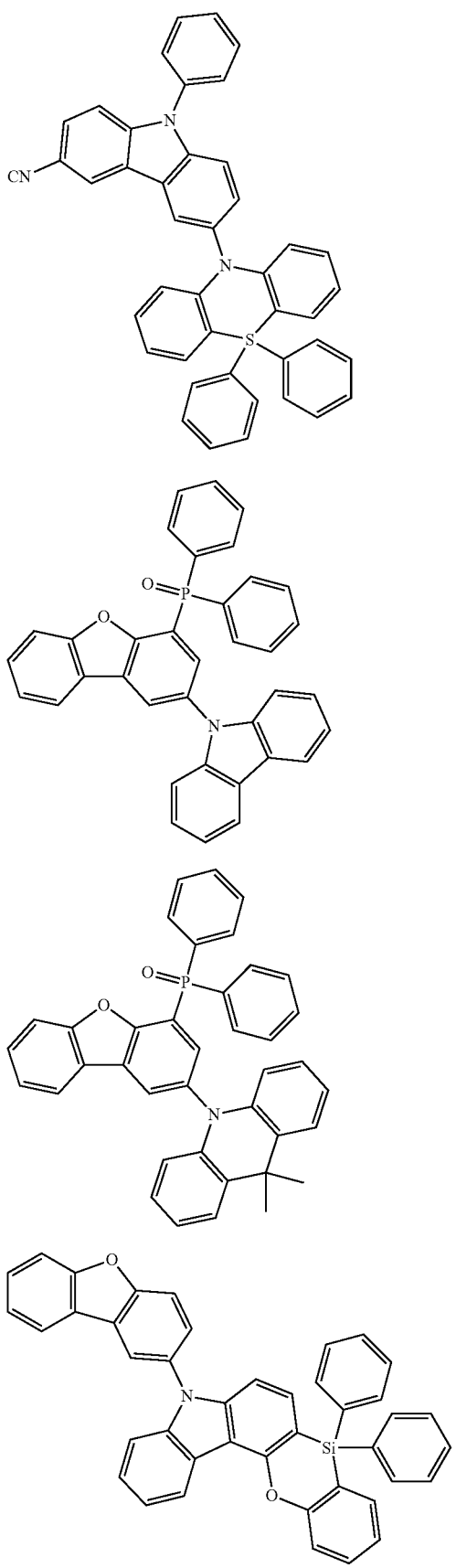
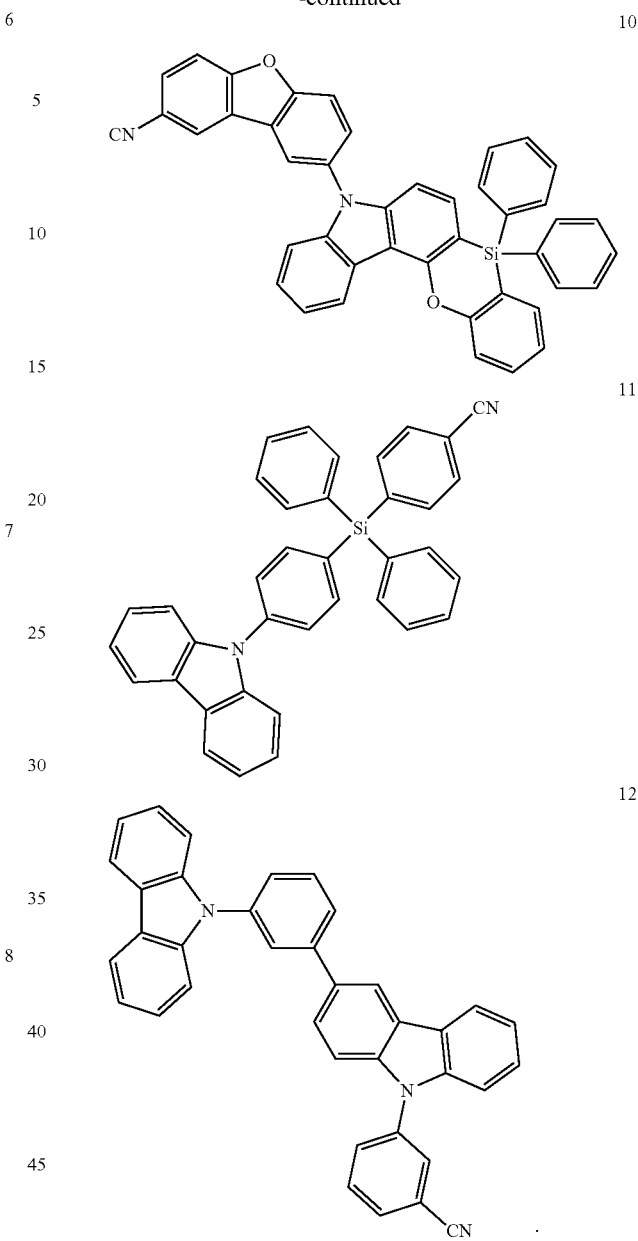

The electron blocking layer may consist of a single compound or a mixture including at least two different compounds.

In some embodiments, the electron blocking material may be identical to the host, but embodiments are not limited thereto. For example, the electron blocking material may be identical to the hole transporting host, but embodiments are not limited thereto.

In some embodiments, a thickness ($D_E$) of the emission layer 131 ≥a thickness ($D_{EB}$) of the electron blocking layer 132. In particular, a thickness ($D_E$) of the emission layer 131 ≥a thickness ($D_{EB}$) of the electron blocking layer 132, but embodiments are not limited thereto. When the range described above is satisfied, the organic light-emitting device may have improved efficiency while not increasing the driving voltage.

In some embodiments, a thickness of the electron blocking layer 132 may be in a range of about 10 Å to about 200

Å, but embodiments are not limited thereto. When the range described above is satisfied, the organic light-emitting device may have improved efficiency while not substantially increasing the driving voltage.

In some embodiments, the organic layer 130 may include a hole transport layer located between the anode 110 and the electron blocking layer 132, wherein the hole transport layer may include a hole transporting material, and the host and the hole transporting material may each satisfy Equation 6:

$$T1(H) \geq T1(HT), \quad \text{Equation 6}$$

wherein, in Equation 6,

T1(H) indicates a lowest excited triplet energy level of the host, and

T1(HT) indicates a lowest excited triplet energy level of the hole transporting material.

When Equation 6 is satisfied, an organic light-emitting device may have further improved efficiency.

The emission layer 131 may include a host and a dopant.

In some embodiments, the host may satisfy T1(H)≥T1 (D), but embodiments are not limited thereto. When the host satisfies this range, excitons may move from the host to the dopant smoothly.

The host may include at least one selected from TPBi, 9,10-di(2-naphthyl)anthracene (ADN), 2-methyl-9,10-bis (naphthalen-2-yl)anthracene (MADN), 9,10-di-(2-naphthyl)-2-t-butyl-anthracene (TBADN), 4,4'-bis(N-carbazolyl)-1,1'-biphenyl (CBP), CPBP, 1,3-di-9-carbazolylbenzene (mCP), 1,3,5-tri(carbazol-9-yl)benzene (TCP), bis(4-(9H-carbazol-9-yl)phenyl)diphenylsilane (BCPDS), and 4-(1-(4-(diphenylamino)phenyl)cyclohexyl) phenyl)diphenyl-phosphine oxide (POPCPA), but embodiments are not limited thereto:

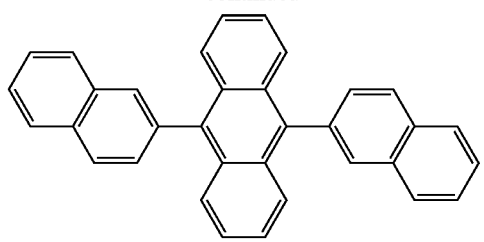

ADN

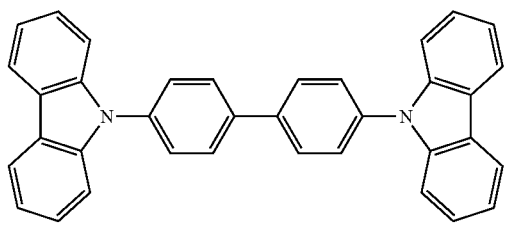

CBP

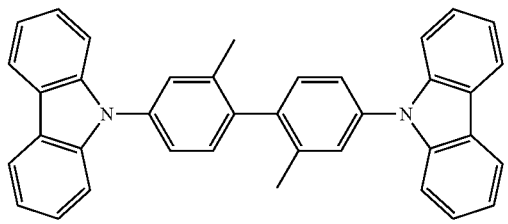

CDBP

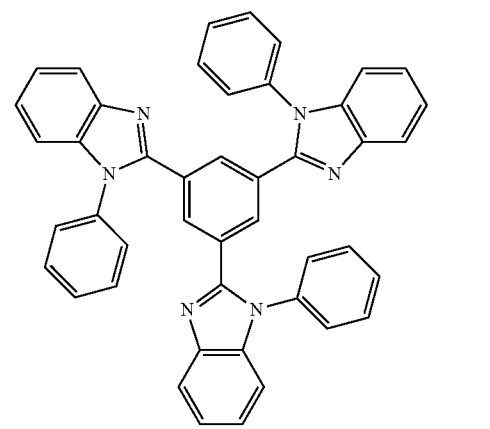

TPBi

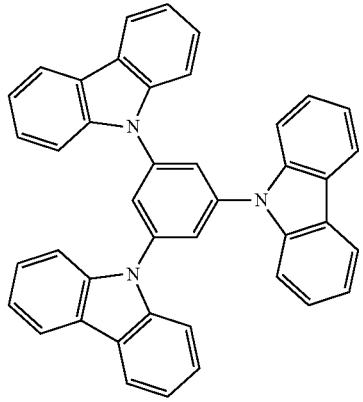

TCP

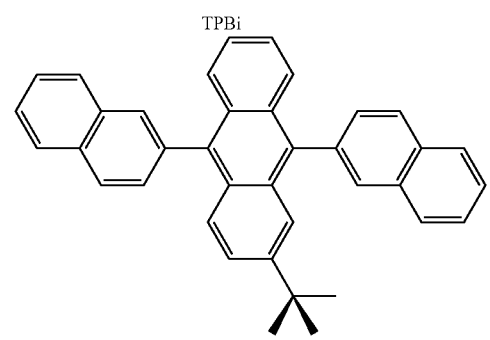

TBADN

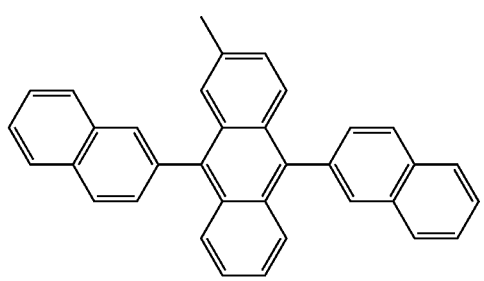

MADN

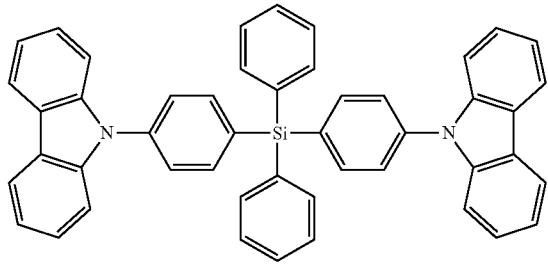

BCPDS

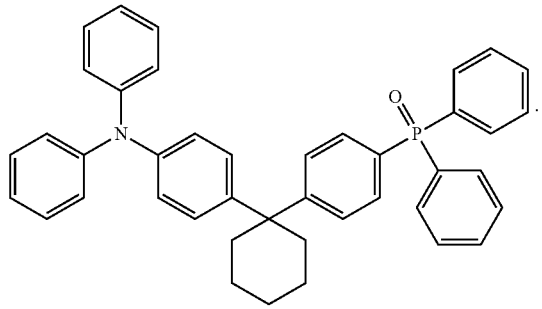

POPCPA

In some embodiments, the host may include a compound represented by one of Formulae 1 and 2, but embodiments are not limited thereto:

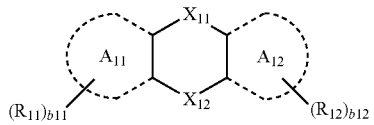
Formula 1

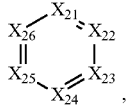
Formula 2 wherein, in Formulae 1 and 2, $X_{11}$ may be selected from O, S, $N(R_{13})$, and $C(R_{13})(R_{14})$, $X_{12}$ may be selected from a single bond, O, S, $N(R_{15})$, and $C(R_{15})(R_{16})$, $A_{11}$ and $A_{12}$ may each independently be selected from a $C_5$-$C_{60}$ carbocyclic group and a $C_1$-$C_{60}$ heterocyclic group, $R_{11}$ to $R_{16}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —B$(Q_1)(Q_2)$, —N$(Q_1)(Q_2)$, —P$(Q_1)(Q_2)$, —C(=O)$(Q_1)$, —S(=O)$(Q_1)$, —S(=O)$_2$$(Q_1)$, —P(=O)$(Q_1)(Q_2)$, and —P(=S)$(Q_1)(Q_2)$, b11 and b12 may each independently be selected from 1, 2, 3, 4, 5, and 6, wherein $Q_1$ to $Q_3$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, $X_{21}$ may be N or $C(R_{21})$, $X_{22}$ may be N or $C(R_{22})$, $X_{23}$ may be N or $C(R_{23})$, $X_{24}$ may be N or $C(R_{24})$, $X_{25}$ may be N or $C(R_{25})$, and $X_{26}$ may be N or $C(R_{26})$, provided that at least one of $X_{21}$ to $X_{26}$ may be N, $R_{21}$ to $R_{26}$ may each independently be selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{21}$ to $R_{26}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, the host may be selected from Compounds 1 to 12 and 21 to 27, but embodiments are not limited thereto:

1

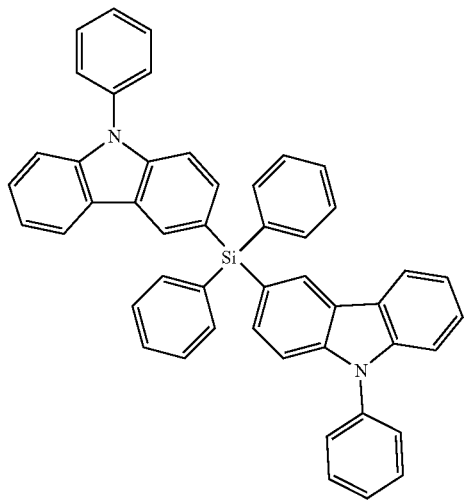

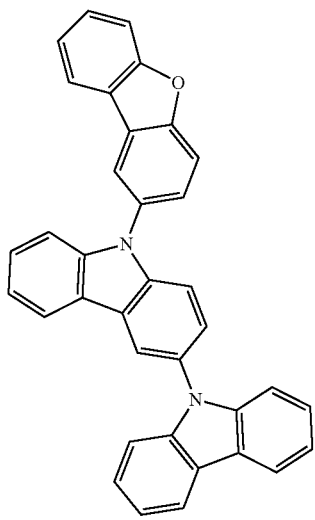
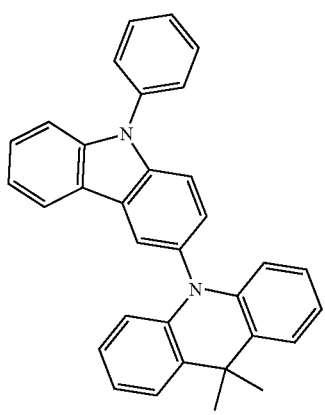
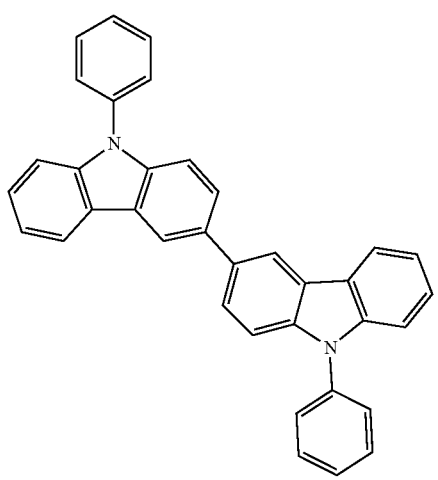
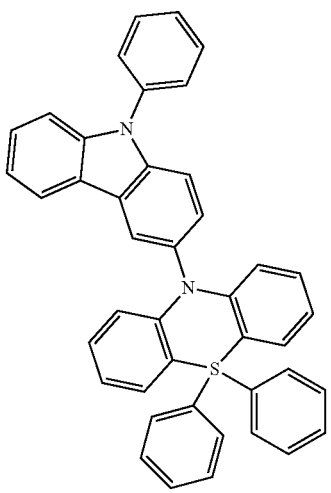
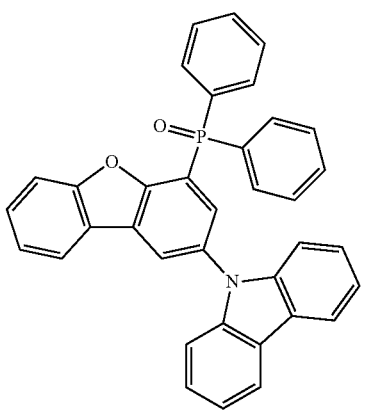

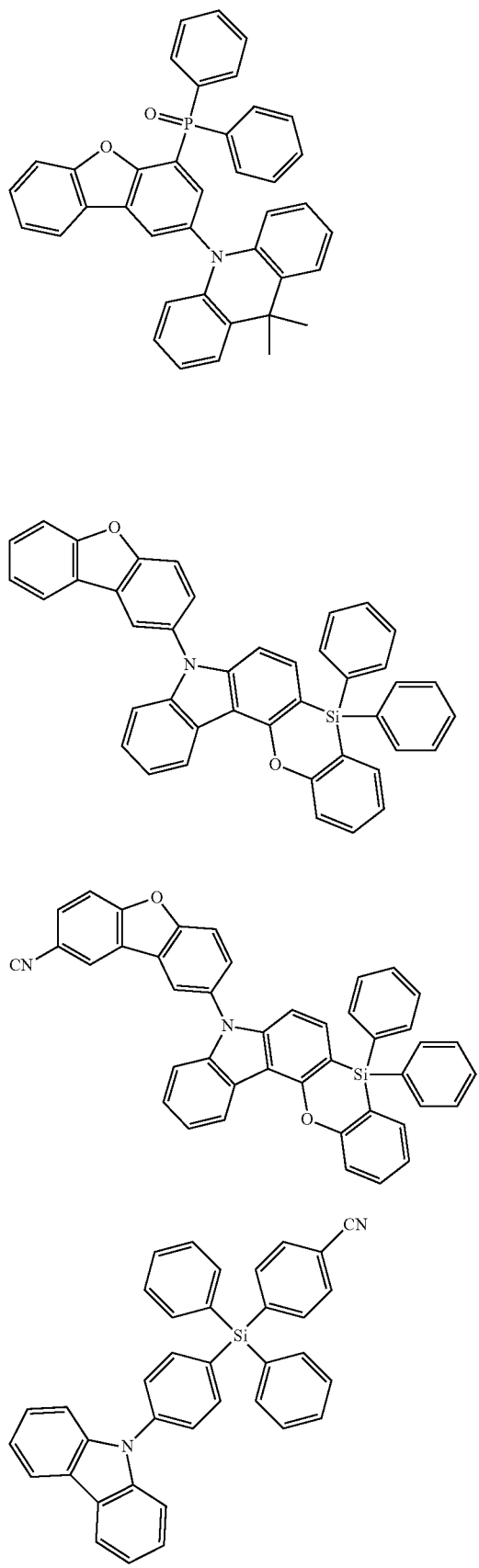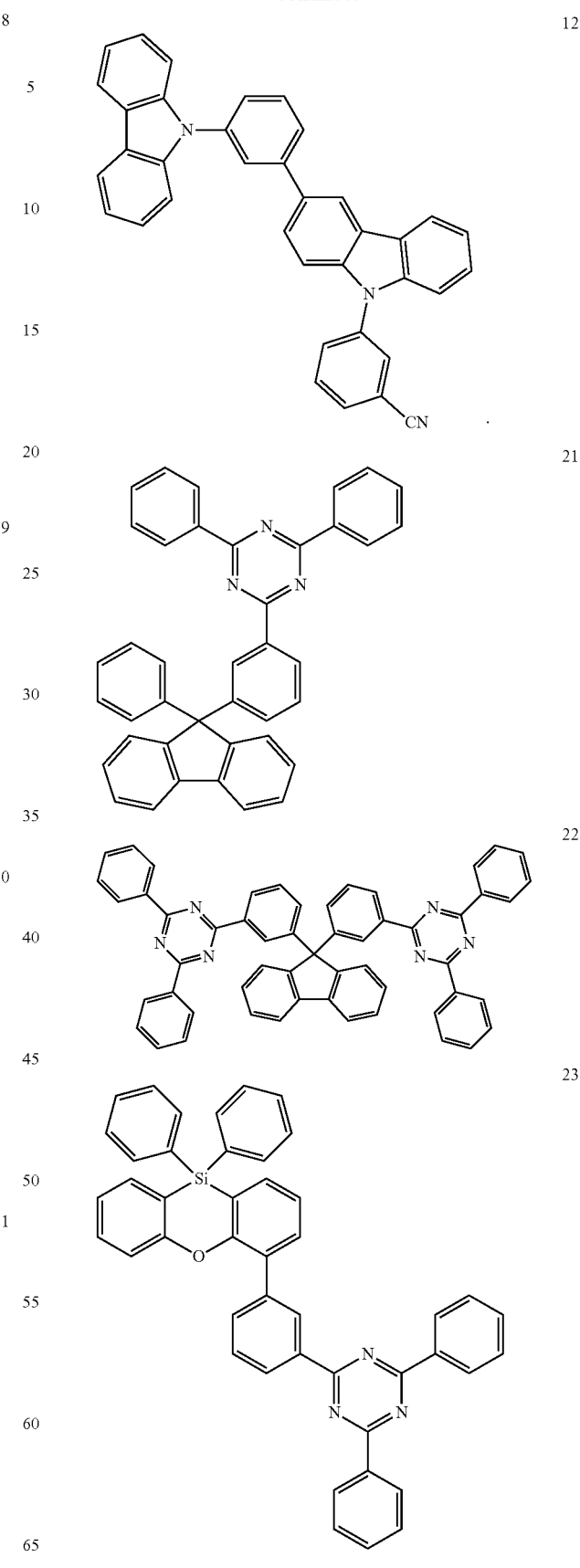

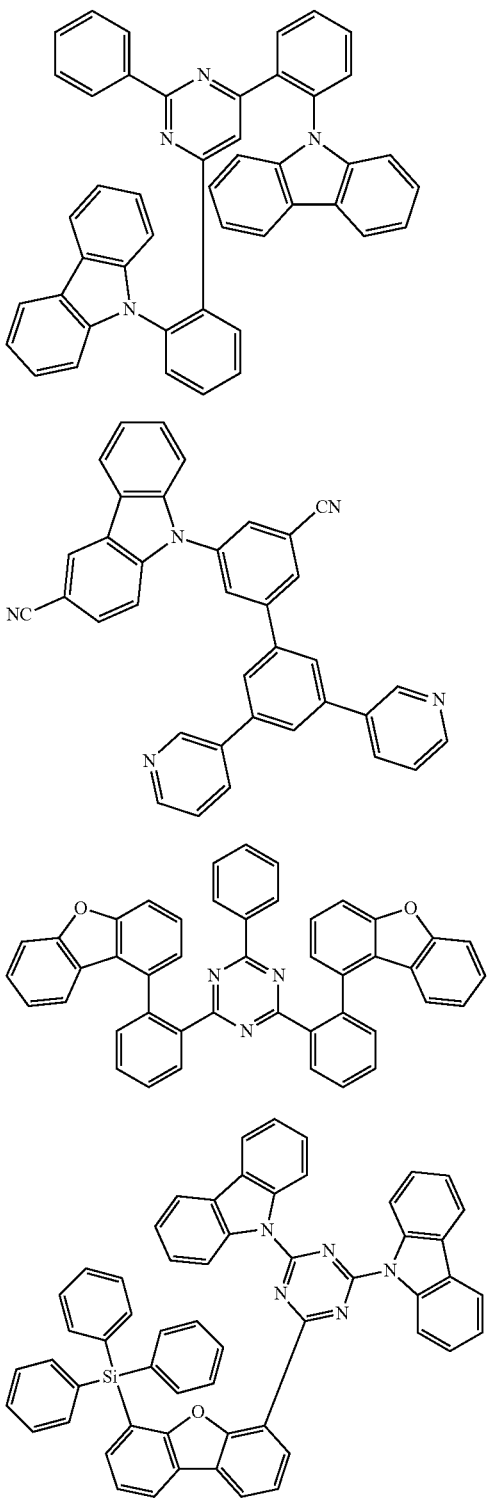

In some embodiments, the host may consist of a single compound.

In some embodiments, the host may include at least one compound, e.g., the first host and the second host.

According to one or more embodiments, the first host may be a hole transporting host not including an electron transporting moiety, and the second host may be an electron transporting host including at least one electron transporting moiety, but embodiments are not limited thereto.

The term "electron transporting moiety", as used herein, may include a cyano group, a phosphine oxide group, a sulfone oxide group, a sulfonate group, and/or a TT electron-depleted nitrogen-containing ring. For example, the first host may be represented by Formula 1, and the second host may be represented by Formula 2, but embodiments are not limited thereto.

In some embodiments, the first host may be selected from Compounds 1 to 12, and the second host may be selected from Compounds 21 to 27, but embodiments are not limited thereto.

In some embodiments, the first host may be identical to the electron blocking material, but embodiments are not limited thereto.

In some embodiments, the second host may be identical to the hole blocking material, but embodiments are not limited thereto.

The dopant may emit thermal activated delayed fluorescence or fluorescence.

In some embodiments, the dopant may satisfy Equation 3:

$$|S1(D)-T1(D)| \leq 0.5 \text{ eV} \qquad \text{Equation 3}$$

wherein, in Equation 3,

T1(D) indicates a lowest excited triplet energy level of the dopant, and

S1(D) indicates a lowest excited singlet energy level of the dopant.

When Equation 3 is satisfied, thermal activated delayed fluorescence may be emitted even at room temperature.

In particular, $|S1(D)-T1(D)| \leq 0.2$ eV may be satisfied, but embodiments are not limited thereto.

In some embodiments, the dopant may satisfy Equation 4 and/or Equation 5, but embodiments are not limited thereto:

$$2.65 \text{ eV} \leq S1(D) \leq 2.85 \text{ eV} \qquad \text{Equation 4}$$

$$2.65 \text{ eV} \leq T1(D) \leq 3.05 \text{ eV} \qquad \text{Equation 5}$$

wherein, in Equations 4 and 5,

T1(D) indicates a lowest excited triplet energy level of the dopant, and

S1(D) indicates a lowest excited singlet energy level of the dopant.

When Equation 4 and/or Equation 5 is satisfied, the dopant may emit blue light.

In some embodiments, the dopant may not include a metal atom. That is, the dopant is different from a phosphorescence-emitting emitter including a metal atom.

For example, the dopant may have a D-shape structure including an electron-donating group (D) and an electron-accepting group (A). In particular, the dopant may be a compound described in Japanese Application Publication No. 2011-140046, Japanese Application Publication No. 2013-034967, Japanese Application Publication No. 2015-530745, Japanese Application Publication No. 2013-034967, Japanese Application Publication No. 2014-512416, Japanese Application Publication No. 2015-525248, Japanese Application Publication No. 2013-524707, Japanese Application Publication No. 2013-547225, Japanese Application Publication No. 2012-274324, Japanese Application Publication No. 2015-504322, U.S. Patent Publication No. 2012-0217869, WO 2015-118035, WO 2016-091887, WO 2016-096851, Korean Application Publication 10-2017-7005332, Japanese Application Publication No. 2014-SI 8737, U.S. Patent Publication No. 2016-0197286, U.S. Patent Publication No. 2014-

0138627, U.S. Patent Publication No. 2014-0145149, U.S. Patent Publication No. 2014-0158992, U.S. Patent Publication No. 2014-0145151, U.S. Patent Publication No. 2015-0021555, U.S. Patent Publication No. 2014-0332758, Korean Application Publication 10-2014-0154391, Japanese Application Publication No. 2015-148588, Japanese Application Publication No. 2016-506442, Japanese Application Publication No. 2015-531748, Japanese Application Publication No. 2016-538300, Japanese Application Publication No. 2016-538393, Japanese Application Publication No. 2015-095814, Japanese Application Publication No. 2012-538639, Japanese Application Publication No. 2014-525803, Japanese Application Publication No. 2012-546858, Japanese Application Publication No. 2016-538300, or Japanese Application Publication No. 2014-538540, but embodiments are not limited thereto.

In some embodiments, the dopant may have a D-A-D shape structure or an A-D shape structure. In particular, the dopant may be a compound described in WO 2015-158692, Japanese Application Publication No. 2016-538435, Japanese Application Publication No. 2016-538426, Japanese Application Publication No. 2015-500308, or Japanese Application Publication No. 2015-527231, but embodiments are not limited thereto.

In some embodiments, the dopant may be a transition metal complex. In particular, the dopant may be a Cu complex or a Pt complex, and the dopant may be a compound described in Korean Application Publication 10-2012-7017497, Korean Application Publication 10-2013-7001396, Korean Application Publication 10-2014-0068027, Korean Application Publication 10-2014-7003327, or U.S. Patent Publication No. 2011-0304262, but embodiments are not limited thereto.

In some embodiments, the dopant may be a compound including a B—N structure, and the dopant may be a compound described in U.S. Patent Publication No. 2014-0027734, but embodiments are not limited thereto.

In some embodiments, the dopant may be a compound described in Japanese Application Publication No. 2015-508569 or Japanese Application Publication No. 2014-554306, but embodiments are not limited thereto.

The electron-donating group (D) may be, for example, a carbazole group, a dibenzothiophene group, a dibenzofuran group, an indolocarbazole group, or a biscarbazole group, but embodiments are not limited thereto.

The electron-accepting group (A) may be CN, F, an aryl group substituted with CN, and/or F or a π electron-depleted nitrogen-containing cyclic group, but embodiments are not limited thereto.

A content of the dopant in the emission layer may be in a range of about 0.01 percent by volume (vol %) to about 50 vol %, but embodiments are not limited thereto. In some embodiments, a content of the dopant in the emission layer may be about 0.1 vol % or greater or about 30 vol % or less, but embodiments are not limited thereto.

The thickness of the emission layer 131 may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

The electron transport region may have i) a single-layered structure consisting of a single layer consisting of a single material, ii) a single-layered structure consisting of a single layer including a plurality of different materials, or iii) a multi-layered structure each having a plurality of layers, each having a plurality of different materials.

The electron transport region may include, in addition to a hole blocking layer, at least one selected from a buffer layer, an electron control layer, an electron transport layer, and an electron injection layer, but embodiments are not limited thereto.

In some embodiments, the electron transport region may have a hole blocking layer/electron transport layer/electron injection layer structure, a hole blocking layer/electron control layer/electron transport layer/electron injection layer structure, or a hole blocking layer/buffer layer/electron transport layer/electron injection layer structure, wherein layers of each structure are sequentially stacked on the emission layer in each stated order, but embodiments are not limited thereto.

The hole blocking material may satisfy 2.5 eV≤T1(HB) ≤3.5 eV, but embodiments are not limited thereto. When the range described above is satisfied, excitons may be substantially confined in the emission layer, thus allowing excitons in the emission layer to sufficiently participate in emission.

The hole blocking material may be represented by Formula 2, but embodiments are not limited thereto:

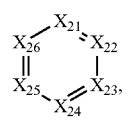

Formula 2 wherein, in Formula 2, $X_{21}$ may be N or $C(R_{21})$, $X_{22}$ may be N or $C(R_{22})$, $X_{23}$ may be N or $C(R_{23})$, $X_{24}$ may be N or $C(R_{24})$, $X_{25}$ may be N or $C(R_{25})$, and $X_{26}$ may be N or $C(R_{26})$, provided that at least one of $X_{21}$ to $X_{26}$ may be N, $R_{21}$ to $R_{26}$ may each independently be selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{21}$ to $R_{26}$ may be selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, the hole blocking material may be selected from Compounds 21 to 27, but embodiments are not limited thereto:

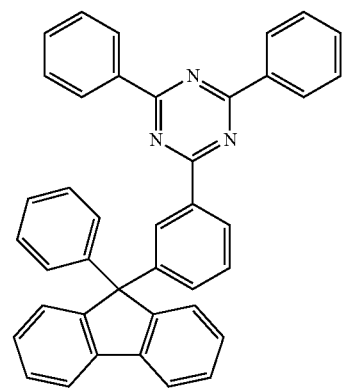

21

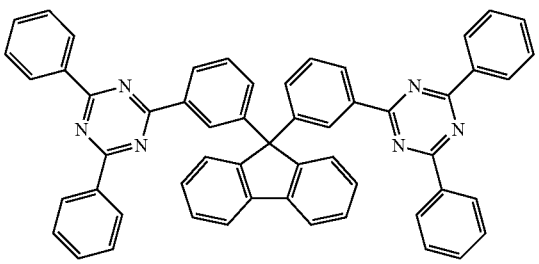

22

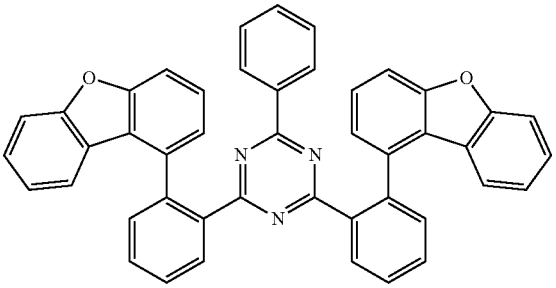

26

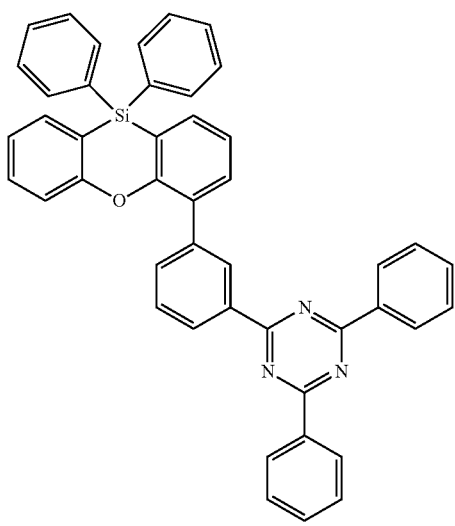

23

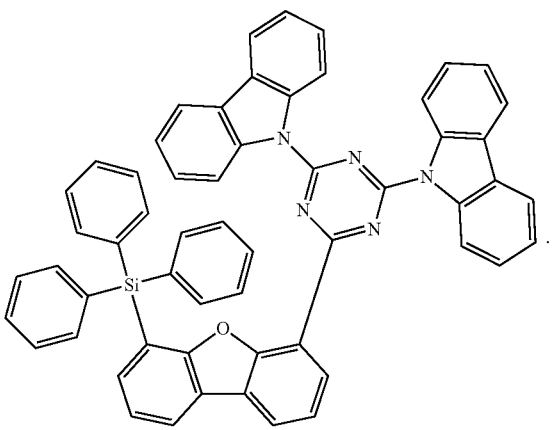

27

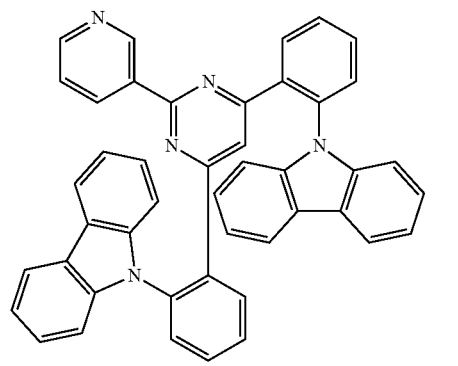

24

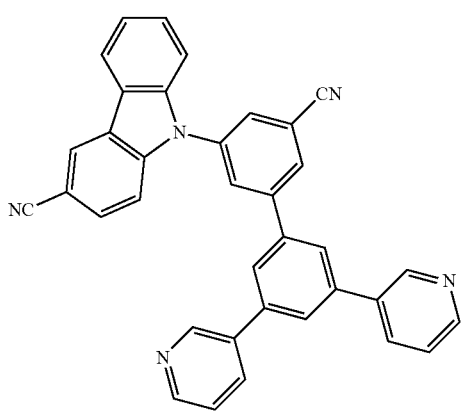

25

The hole blocking layer may consist of a single compound or a mixture including at least two different compounds.

In some embodiments, the hole blocking material may be identical to the host, but embodiments are not limited thereto. For example, the hole blocking material may be identical to the electron transporting host, but embodiments are not limited thereto.

In some embodiments, a thickness ($D_E$) of the emission layer 131 ≥a thickness ($D_{HB}$) of the hole blocking layer 133. In particular, a thickness ($D_E$) of the emission layer 131 >a thickness ($D_{HB}$) of the hole blocking layer 133, but embodiments are not limited thereto. When the range described above is satisfied, the organic light-emitting device may have improved efficiency while not increasing the driving voltage.

In some embodiments, a thickness of the hole blocking layer 133 may be in a range of about 10 Å to about 200 Å, but embodiments are not limited thereto. When the range described above is satisfied, the organic light-emitting device may have improved efficiency, while not substantially increasing the driving voltage.

In some embodiments, the organic layer 130 may include an electron transport layer located between the cathode 120 and the hole blocking layer 133, wherein the electron transport layer may include an electron transporting material, and the dopant and the electron transporting material may each satisfy Equation 7:

$$T1(D) \geq T1(ET) \qquad \text{Equation 7}$$

wherein, in Equation 7,

T1(D) indicates a lowest excited triplet energy level of the dopant, and

T1(ET) indicates a lowest excited triplet energy level of the electron transporting material.

The electron transport region (for example, the buffer layer, the electron control layer, or the electron transport layer in the electron transport region) may include a metal-free compound including at least one TT electron-depleted nitrogen-containing ring.

The term "TT electron-depleted nitrogen-containing ring" as used herein refers to a $C_1$-$C_{60}$ heterocyclic group having at least one *—N=*' moiety as a ring-forming moiety.

For example, the "TT electron-depleted nitrogen-containing ring" may be i) a 5-membered to 7-membered heteromonocyclic group having at least one *—N=*' moiety, ii) a heteropolycyclic group in which at least two 5-membered to 7-membered heteromonocyclic groups, each having at least one *—N=*' moiety, are condensed, or iii) a heteropolycyclic group in which at least one of a 5-membered to 7-membered heteromonocyclic group, each having at least one *—N=*' moiety, is condensed with at least one $C_5$-$C_{60}$ carbocyclic group.

Examples of the TT electron-depleted nitrogen-containing ring may include imidazole, pyrazole, thiazole, isothiazole, oxazole, isoxazole, pyridine, pyrazine, pyrimidine, pyridazine, indazole, purine, quinoline, isoquinoline, benzoquinoline, phthalazine, naphthyridine, quinoxaline, quinazoline, cinnoline, phenanthridine, acridine, phenanthroline, phenazine, benzimidazole, isobenzothiazole, benzoxazole, isobenzoxazole, triazole, tetrazole, oxadiazole, triazine, thiadiazole, imidazopyridine, imidazopyrimidine, and azacarbazole, but embodiments are not limited thereto.

In some embodiments, the electron transport region may include a compound represented by Formula 601:

[Ar$_{601}$]$_{xe11}$-[(L$_{601}$)$_{xe1}$-R$_{601}$]$_{xe21}$,  Formula 601 wherein, in Formula 601,

Ar$_{601}$ may be selected from a substituted or unsubstituted $C_5$-$C_{60}$ carbocyclic group and a substituted or unsubstituted $C_1$-$C_{60}$ heterocyclic group, xe11 may be 1,2, or 3, L$_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, R$_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_{601}$)(Q$_{602}$)(Q$_{603}$), —C(=O)(Q$_{601}$), —S(=O)$_2$(Q$_{601}$), and —P(=O)(Q$_{601}$)(Q$_{602}$), wherein Q$_{601}$ to Q$_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of Ar$_{601}$(s) in the number of xe11 and R$_{601}$(S) in the number of xe21 may include the TT electron-depleted nitrogen-containing ring.

In some embodiments, in Formula 601, Ar$_{601}$ may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si(Q$_{31}$)(Q$_{32}$)(Q$_{33}$), —S(=O)$_2$(Q$_{31}$), and —P(=O)(Q$_{31}$)(Q$_{32}$), wherein Q$_{31}$ to Q$_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or greater, at least two Ar$_{601}$(s) may be bound via a single bond.

In one or more embodiments, Ar$_{601}$ in Formula 601 may be an anthracene group.

In one or more embodiments, a compound represented by Formula 601 may be represented by Formula 601-1:

Formula 601-1

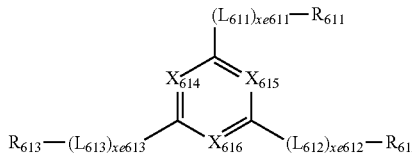

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_6n$ to $L_{613}$ may each independently be understood by referring to the description of $L_{601}$ provided herein, xe611 to xe613 may each independently be understood by referring to the description of xe1 provided herein, $R_{611}$ to $R_{613}$ may each independently be understood by referring to the description of $R_{601}$ provided herein, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In an embodiment, in Formulae 601 and 601-1, $L_{601}$ and $L_6n$ to $L_{613}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments are not limited thereto.

In one or more embodiments, xe1 and xe611 to xe613 in Formulae 601 and 601-1 may each independently be 0, 1, or 2.

In one embodiment, in Formulae 601 and 601-1, $R_{601}$ and $R_{611}$ to $R_{613}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S($=$O)$_2$(Q$_{601}$) and —P($=$O)(Q$_{601}$)(Q$_{602}$), wherein Q$_{601}$ and Q$_{602}$ may respectively be understood by referring to the descriptions of Q$_{601}$ and Q$_{602}$ provided herein.

The electron transport region may include at least one compound selected from Compounds ET1 to ET36, but embodiments are not limited thereto:

ET1

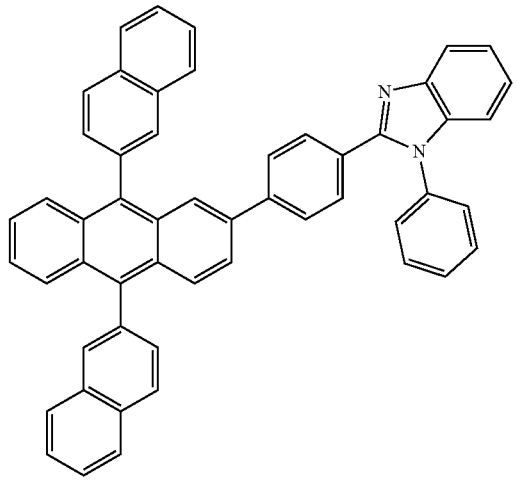

ET2

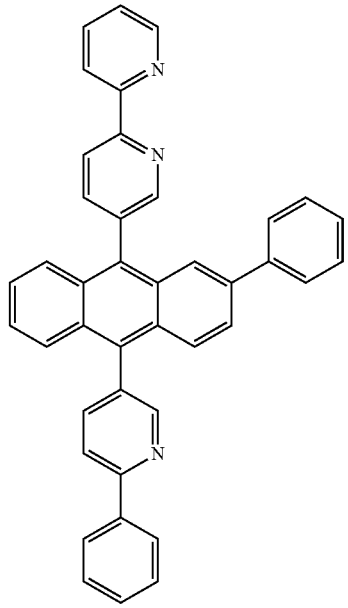

ET3
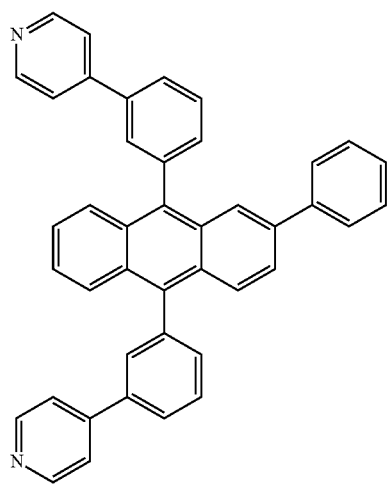
ET4
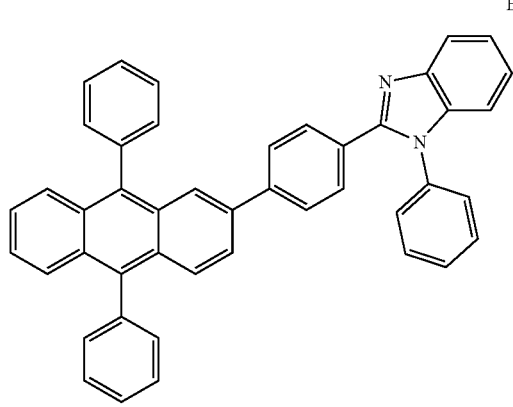
ET5
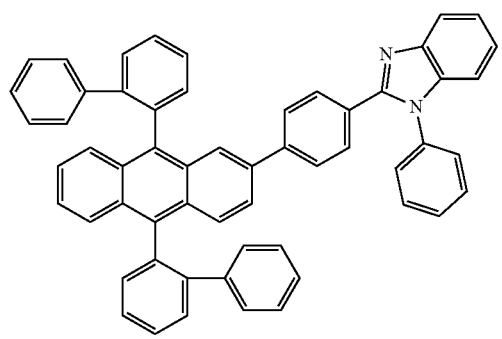
ET6
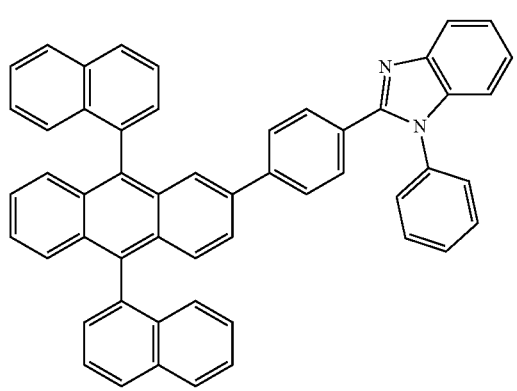
ET7
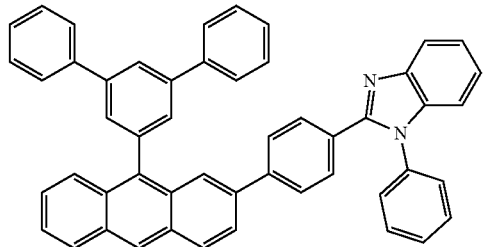
ET8
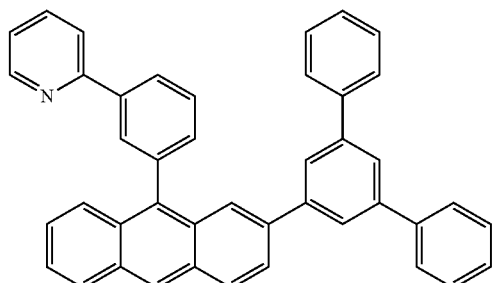
ET9
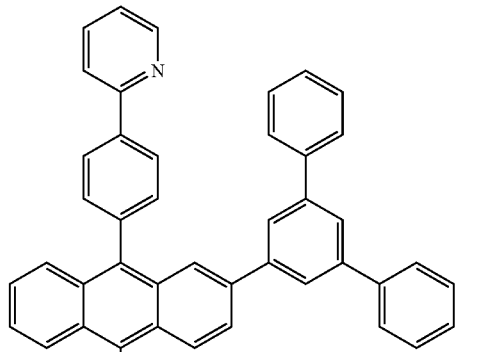

ET10
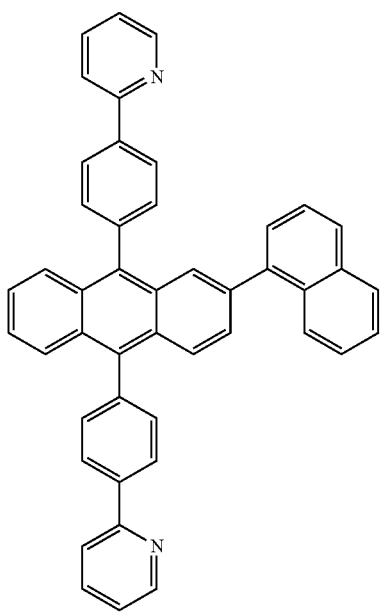
ET11
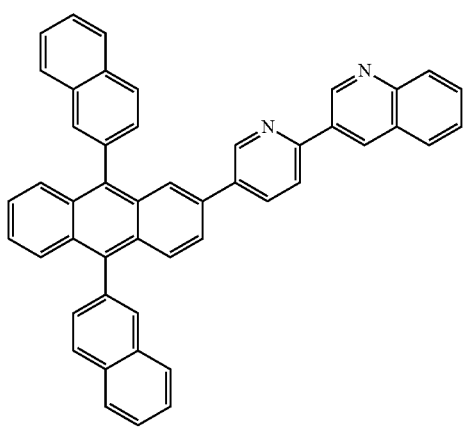
ET12
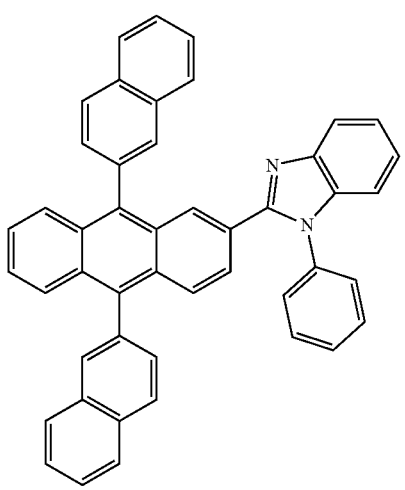
ET13
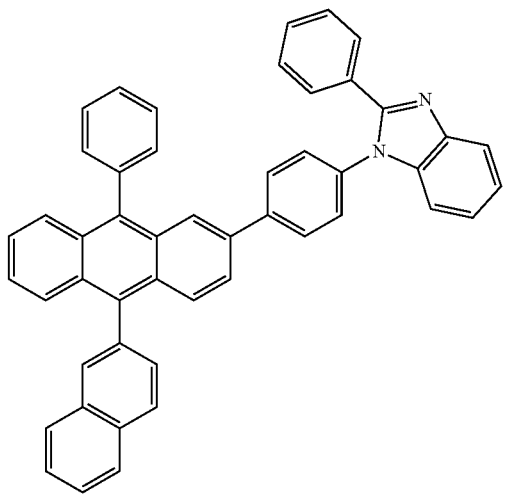
ET14
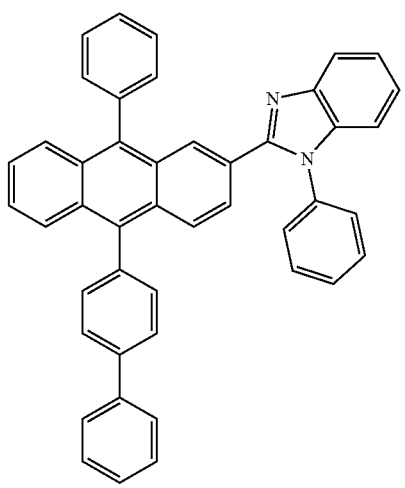
ET15
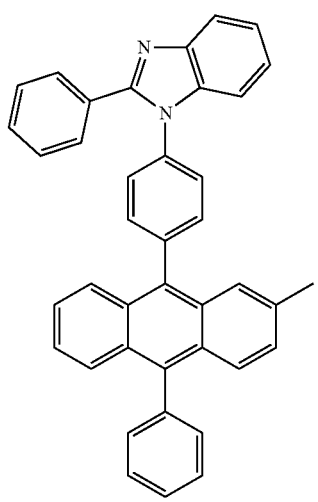

ET16
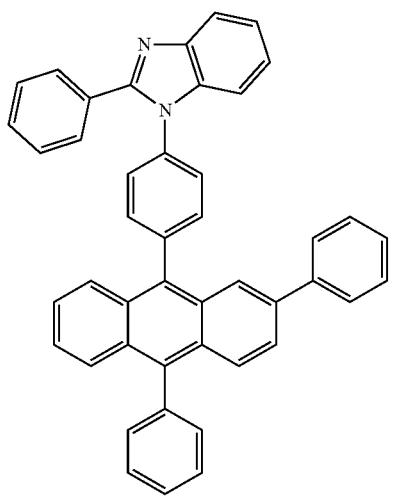
ET19
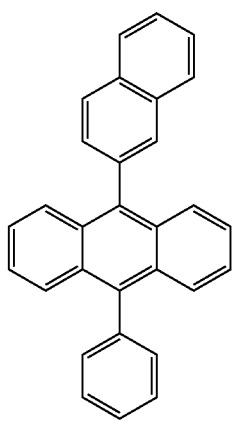
ET17
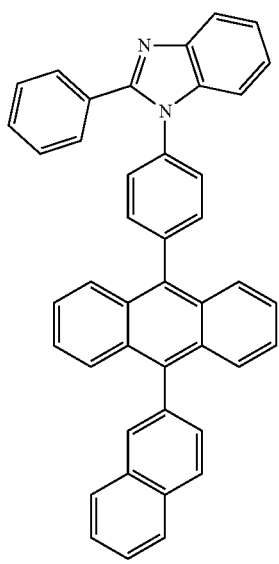
ET20
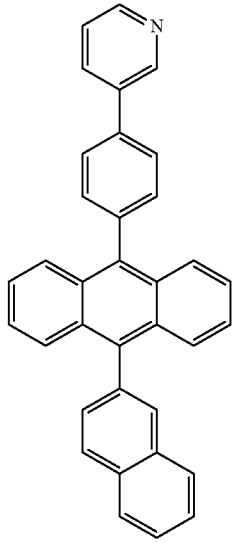
ET18
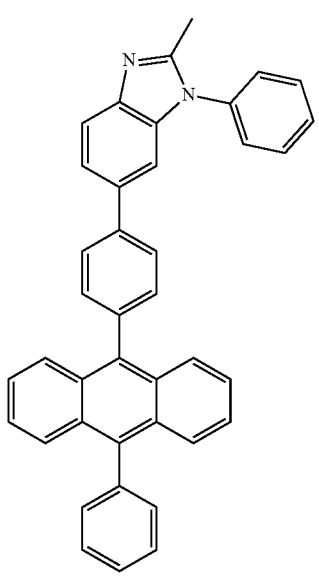
ET21
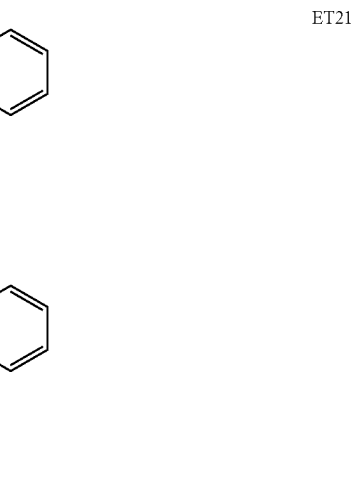

ET22
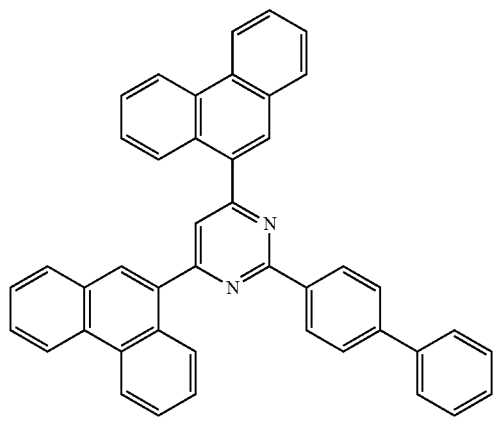
ET23
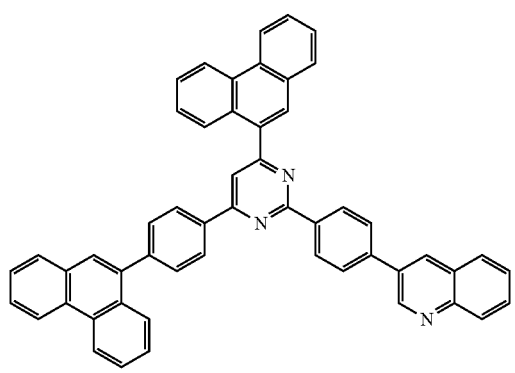
ET24
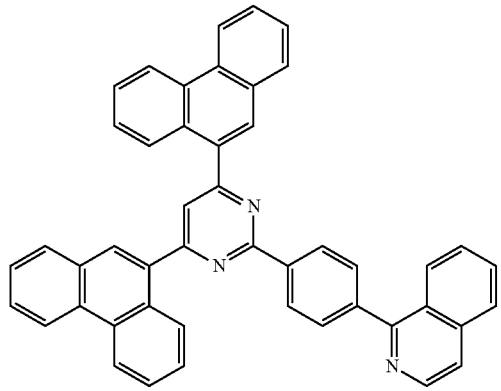
ET25
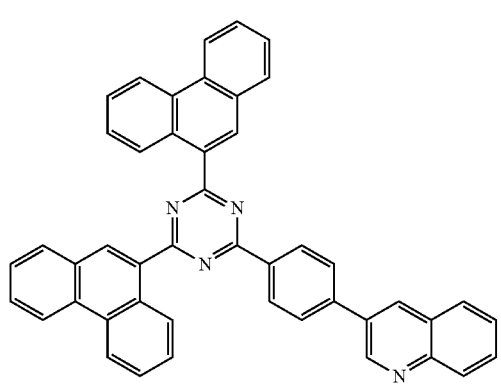
ET26
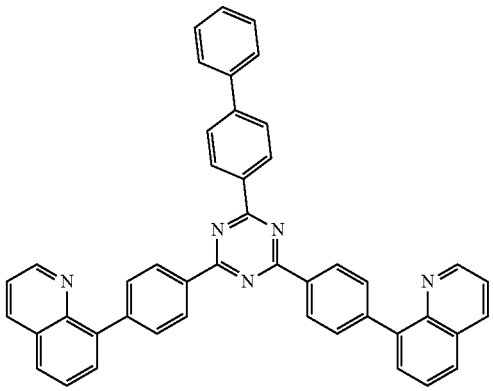
ET27
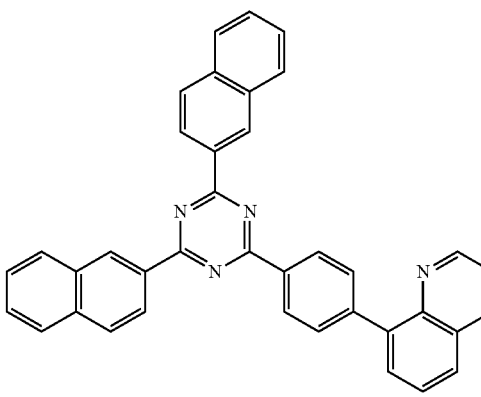
ET28
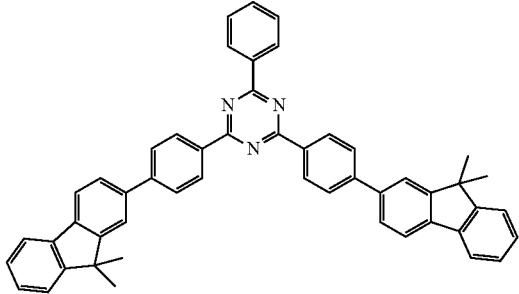
ET29
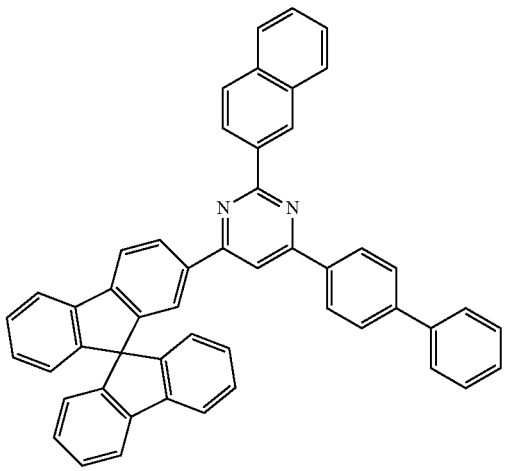

ET30
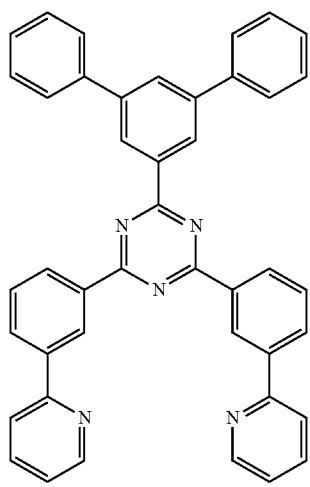
ET31
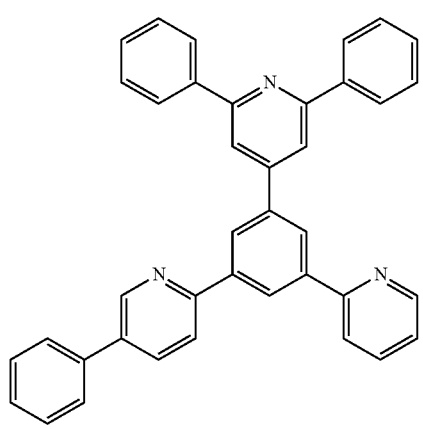
ET32
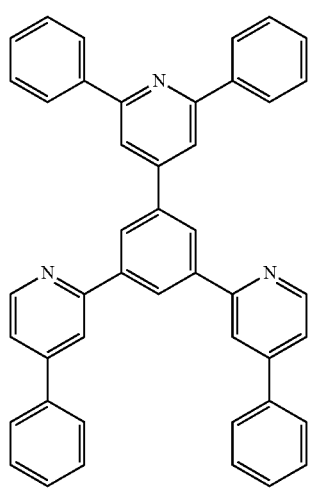
ET33
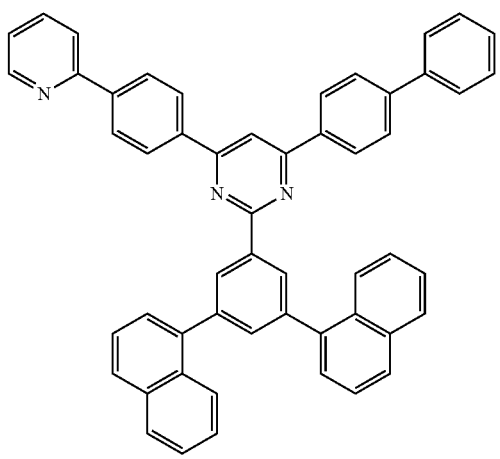
ET34
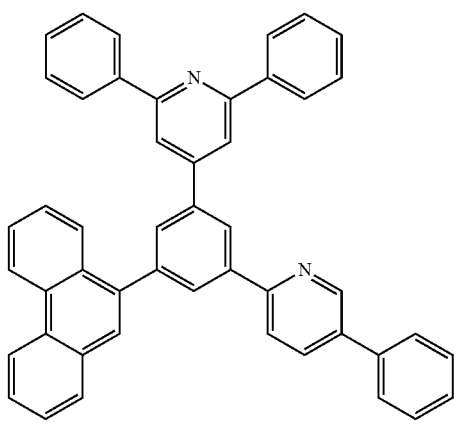
ET35
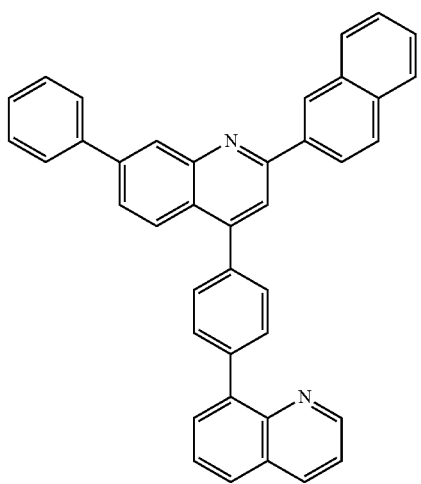

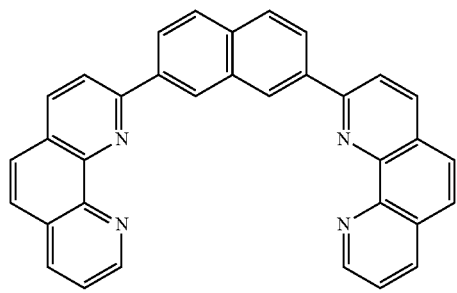

ET36

In some embodiments, the electron transport region may include at least one compound selected from 2,9-dimethyl-4,7-diphenyl-1,10-phenanthroline (BCP), 4,7-diphenyl-1,10-phenanthroline (Bphen), Alq₃, BAlq, 3-(biphenyl-4-yl)-5-(4-tert-butylphenyl)-4-phenyl-4H-1,2,4-triazole (TAZ), NTAZ, diphenyl[4-(triphenylsilyl)phenyl]phosphine oxide *(TSPO1), 2,2',2"-(1,3,5-benzinetriyl)-tris(1-phenyl-1-H-benzimidazole) (TPBi), and diphenylphosphine oxide (DPEPO):

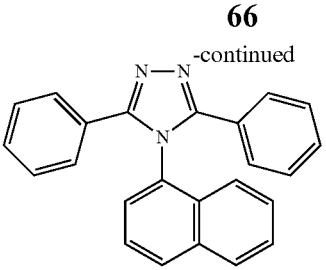

NTAZ

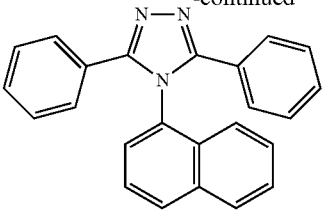

TSPO1

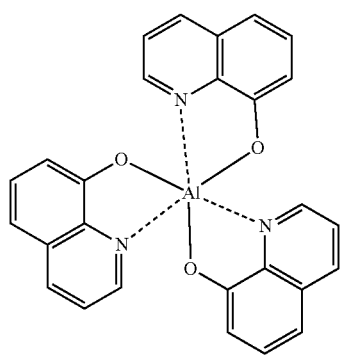

Alq₃

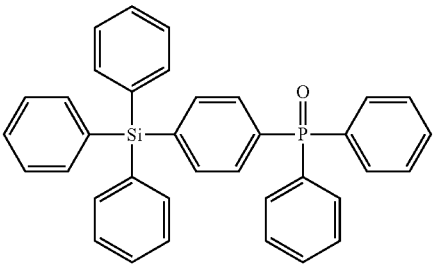

TPBI

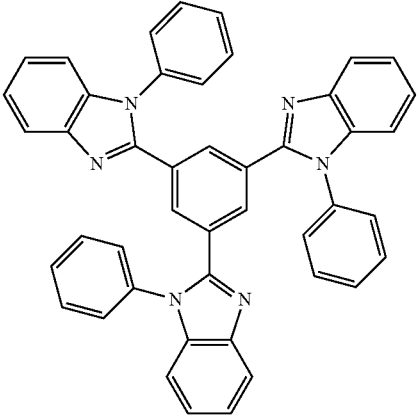

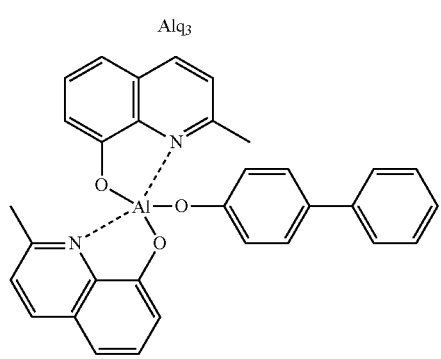

BAlq

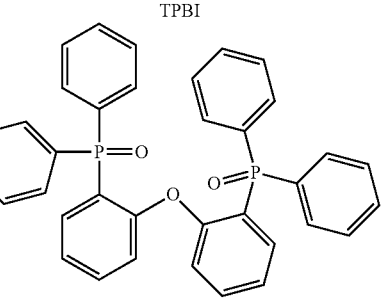

DPEPO

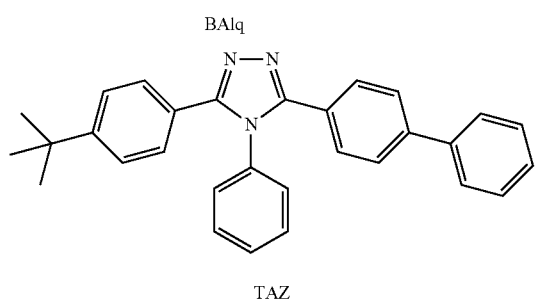

TAZ

The thicknesses of the buffer layer, the hole blocking layer, or the electron control layer may each independently be in a range of about 20 Å to about 1,000 Å, and in some embodiments, about 30 Å to about 300 Å. When the thicknesses of the buffer layer, the hole blocking layer or the electron control layer are within any of these ranges, excellent hole blocking characteristics or excellent electron controlling characteristics may be obtained without a substantial increase in driving voltage.

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion. The alkaline earth metal complex may include a metal ion selected from a beryllium (Be) ion, a magnesium (Mg) ion, a calcium (Ca) ion, a strontium (Sr) ion, and a barium (Ba) ion. Each ligand coordinated with the metal ion of the alkali metal complex and the alkaline earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but embodiments are not limited thereto.

For example, the metal-containing material may include a Li complex. The Li complex may include, e.g., Compound ET-D1 (LiQ) or Compound ET-D2:

ET-D1

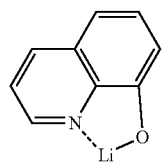

ET-D2

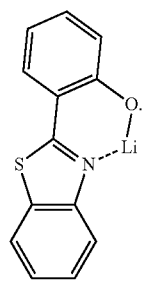

The electron transport region may include an electron injection layer that facilitates injection of electrons from the cathode 120. The electron injection layer may be in direct contact with the cathode 120.

The electron injection layer may have i) a single-layered structure consisting of a single layer consisting of a single material, ii) a single-layered structure consisting of a single layer including a plurality of different materials, or iii) a multi-layered structure having a plurality of layers, each including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

The alkali metal may be selected from Li, Na, K, Rb, and Cs. In some embodiments, the alkali metal may be Li, Na, or Cs. In one or more embodiments, the alkaline metal may be Li or Cs, but is not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth metal compound, and the rare earth metal compound may each independently be selected from oxides and halides (e.g., fluorides, chlorides, bromides, or iodines) of the alkali metal, the alkaline earth metal, and the rare earth metal, respectively.

The alkali metal compound may be selected from alkali metal oxides (such as $Li_2O$, $CS_2O$, or $K_2O$), and alkali metal halides (such as LiF, NaF, CsF, KF, LiI, NaI, CsI, KI, or RbI). In an embodiment, the alkali metal compound may be selected from LiF, $Li_2O$, NaF, LiI, NaI, CsI, and KI, but embodiments are not limited thereto.

The alkaline earth-metal compound may be selected from alkaline earth-metal compounds, such as BaO, SrO, CaO, $Ba_xSr_{1-x}O$ (wherein 0<x<1), and $Ba_xCa_{1-x}O$ (wherein 0<x<1). In an embodiment, the alkaline earth metal compound may be selected from BaO, SrO, and CaO, but embodiments are not limited thereto.

The rare earth metal compound may be selected from $YbF_3$, $ScF_3$, $ScO_3$, $Y_2O_3$, $Ce_2O_3$, $GdF_3$, and $TbF_3$. In some embodiments, the rare earth metal compound may be selected from $YbF_3$, $ScF_3$, $TbF_3$, $YbI_3$, $ScI_3$, and $TbI_3$, but embodiments are not limited thereto.

The alkali metal complex, the alkaline earth metal complex, and the rare earth metal complex may each include ions of the above-described alkali metal, alkaline earth metal, and rare earth metal. Each ligand coordinated with the metal ion of the alkali metal complex, the alkaline earth metal complex, and the rare earth metal complex may independently be selected from hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, and cyclopentadiene, but embodiments are not limited thereto.

The electron injection layer may consist of an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In some embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or a combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The cathode 120 may be on the organic layer 130. A material for forming the cathode 120 may be a material with a low work function, such as a metal, an alloy, an electrically conductive compound, and a combination thereof.

The cathode 120 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments are not limited thereto. The cathode 120 may be a transmissive electrode, a semi-transmissive electrode, or a reflective electrode.

The cathode 120 may have a single-layered structure, or a multi-layered structure including two or more layers.

In the drawing, a substrate may be additionally disposed under (a surface not in contact with the organic layer) the anode 110 or on (a surface not in contact with the organic layer) of the cathode 120. The substrate may be a glass substrate or a plastic substrate, each having excellent mechanical strength, thermal stability, transparency, surface smoothness, ease of handling, and water resistance.

When the organic light-emitting device 1 is a full color organic light-emitting device, the emission layer 131 may be patterned into a red emission layer, a green emission layer, or a blue emission layer, according to a sub-pixel. In one or more embodiments, the emission layer 131 may have a stacked structure. The stacked structure may include two or more layers selected from a red emission layer, a green emission layer, and a blue emission layer. The two or more layers may be in direct contact with each other. In some embodiments, the two or more layers may be separated from each other. In one or more embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The organic light-emitting device 1 may further include a capping layer in a direction to which light is passed. The capping layer may improve the external luminescence efficiency based on the principle of constructive interference.

The capping layer may each independently be a capping layer consisting of an organic material, an inorganic capping layer consisting of an inorganic material, or a composite capping layer including an organic material and an inorganic material.

The capping layer may include at least one material selected from carbocyclic compounds, heterocyclic compounds, amine-based compounds, porphine derivatives, phthalocyanine derivatives, naphthalocyanine derivatives, alkali metal complexes, and alkaline earth metal complexes. The carbocyclic compound, the heterocyclic compound, and the amine group-containing compound may optionally be substituted with a substituent containing at least one element selected from O, N, S, Se, Si, F, Cl, Br, and I.

In some embodiments, the capping layer may include at least one amine-based compound.

In some embodiments, the capping layer may include the compound represented by Formula 201 or the compound represented by Formula 202.

In some embodiments, the capping layer may include a compound selected from Compounds HT28 to HT33 and Compounds CP1 to CP5, but embodiments are not limited thereto:

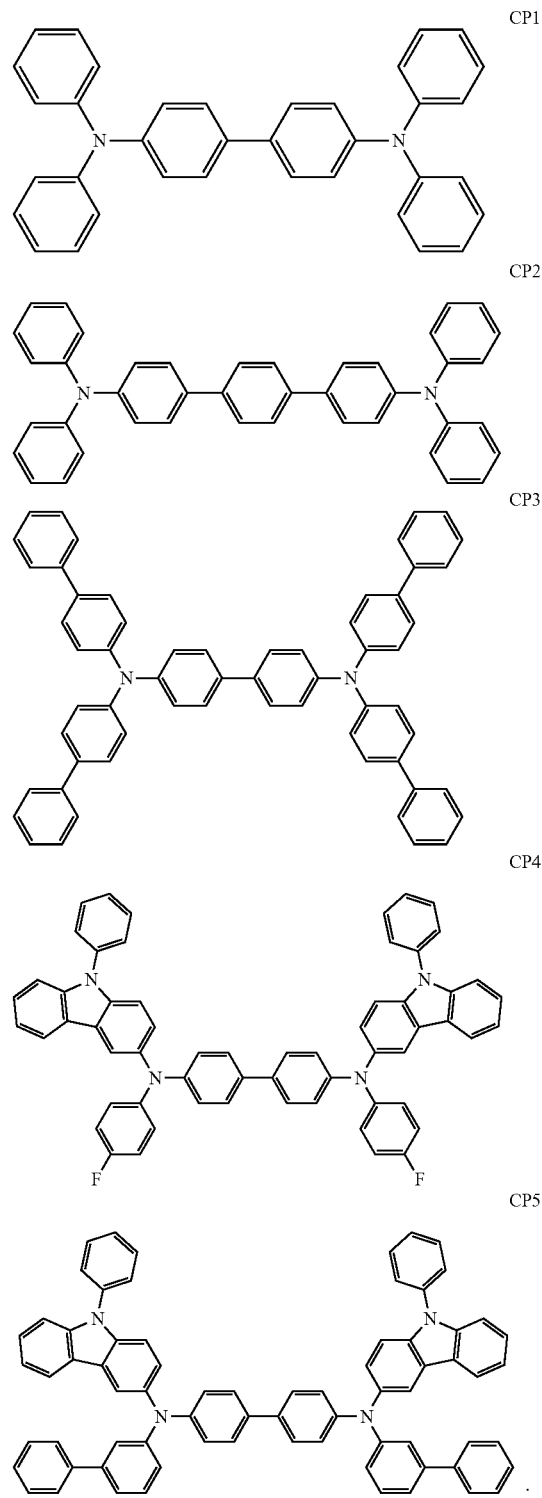

Hereinbefore the organic light-emitting device 10 has been described with reference to the drawing, but embodiments are not limited thereto.

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

The term "$C_1$-$C_{60}$ alkyl group" as used herein refers to a linear or branched aliphatic hydrocarbon monovalent group having 1 to 60 carbon atoms. Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, Si, P, and S as a ring-forming atom and 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system having at least one heteroatom selected from N, O, Si, P, and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, Si, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group.

When the $C_1$-$C_{60}$ heteroaryl group and the $C_1$-$C_{60}$ heteroarylene group each independently include two or more rings, the respective rings may be fused.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$C_1$-$C_{60}$ heteroaryloxy group" as used herein indicates —$OA_{104}$ (wherein $A_{104}$ is a $C_1$-$C_{60}$ heteroaryl group). The term "$C_1$-$C_{60}$ heteroarylthio group" as used herein indicates —$SA_{105}$ (wherein $A_{105}$ is a $C_1$-$C_{60}$ heteroaryl group).

The term "monovalent non-aromatic condensed polycyclic group" as used herein refers to a monovalent group that has two or more rings condensed and only carbon atoms as ring forming atoms (e.g., 8 to 60 carbon atoms), wherein the entire molecular structure is non-aromatic. Examples of the monovalent non-aromatic condensed polycyclic group may include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom selected from N, O, Si, P, and S, in addition to carbon atoms (e.g., 1 to 60 carbon atoms), as a ring-forming atom, wherein the entire molecular structure is non-aromatic. Examples of the monovalent non-aromatic condensed heteropolycyclic group may include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group having 5 to 60 carbon atoms only as ring-forming atoms. The $C_5$-$C_{60}$ carbocyclic group may be an aromatic carbocyclic group or a non-aromatic carbocyclic group. The term "$C_5$-$C_{60}$ carbocyclic group" as used herein refers to a ring (e.g., a benzene group), a monovalent group (e.g., a phenyl group), or a divalent group (e.g., a phenylene group). Also, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that at least one heteroatom selected from N, O, Si, P, and S is used as a ring-forming atom, in addition to carbon atoms (e.g., 1 to 60 carbon atoms).

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group; a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group. The term "Me" as used herein refers to a methyl group. The term "Et" as used herein refers to an ethyl group. The term "ter-Bu" or "Bu$^t$" as used herein refers to a tert-butyl group. The term "OMe" as used herein refers to a methoxy group.

The term "biphenyl group" as used herein refers to a phenyl group substituted with a phenyl group. The "biphenyl group" may be a substituted phenyl group having a $C_6$-$C_{60}$ aryl group as a substituent.

The term "terphenyl group" as used herein refers to a phenyl group substituted with a biphenyl group. The "terphenyl group" may be a substituted phenyl group having a $C_6$-$C_{60}$ aryl group substituted with a $C_6$-$C_{60}$ aryl group as a substituent.

The symbols * and *' as used herein, unless defined otherwise, refer to a binding site to an adjacent atom in a corresponding formula.

Hereinafter an organic light-emitting device according to an embodiment will be described in detail with reference to Examples.

EXAMPLES

Evaluation Example 1: Measurement of T1 Energy Level

T1 energy level of each of compounds used in Example 1 and Comparative Examples 1 to 3 was measured, and the results thereof are shown in Table 1.

TABLE 1

| Compound name | T1 energy level (eV) | Compound name | T1 energy level (eV) |
|---|---|---|---|
| CBP | 2.7 | Compound 21 | 2.9 |
| Compound T1 | 2.6 | Compound A | 1.7 |
| Compound 1 | 2.8 | Compound B | 1.3 |

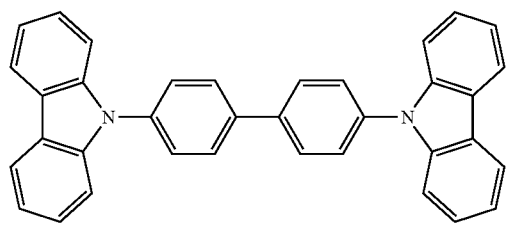

CBP

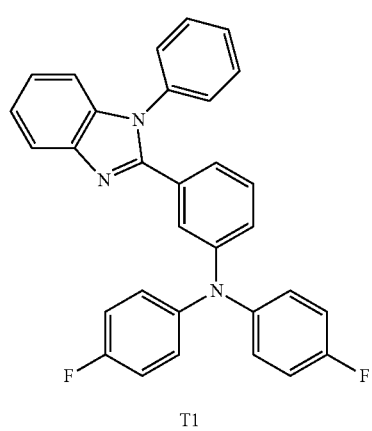

T1

-continued

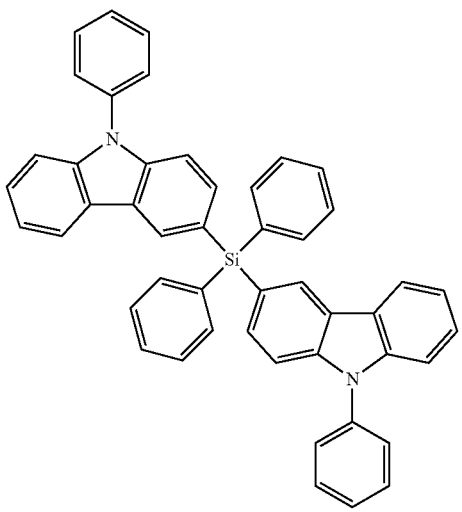

1

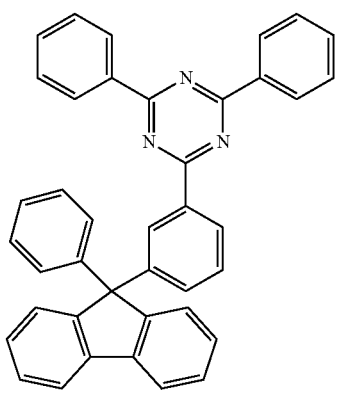

21

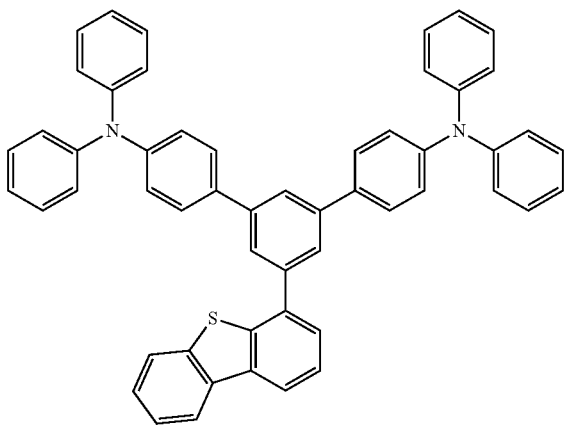

A

-continued

B

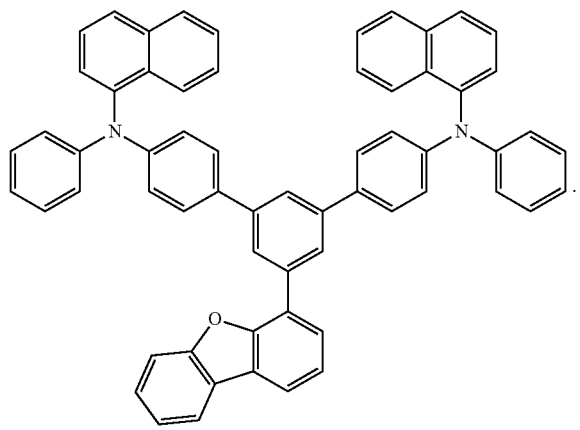

Example 1

An anode was manufactured by cutting a Corning 15 Ω/cm² (1,200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and being exposed to ozone to clean. Then, the anode was loaded into a vacuum deposition apparatus.

2-TNATA was vacuum-deposited on the glass substrate to a thickness of 600 Å to form a hole injection layer. Then, HAT-CN was vacuum-deposited thereon to a thickness of 300 Å to form a hole transport layer.

Compound 1 was vacuum-deposited on the hole transport layer to a thickness of 50 Å to form an electron blocking layer.

CBP (as a host) and Compound T1 (as a dopant) were co-deposited on the electron blocking layer at a weight ratio of 95:5 to form an emission layer having a thickness of 200 Å.

Compound 21 was vacuum-deposited on the emission layer to a thickness of 50 Å to form a hole blocking layer.

ET1 was vacuum-deposited on the hole blocking layer to a thickness of 300 Å to form an electron transport layer. LiF was vacuum-deposited on the electron transport layer to a thickness of 10 Å to form an electron injection layer, and subsequently, Al was vacuum-deposited thereon to a thickness of 3,000 Å (cathode), thereby completing the manufacture of an organic light-emitting device.

Comparative Examples 1 to 3

Organic light-emitting devices were manufactured in substantially the same manner as in Example 1, except that Compounds shown in Table 2 were used in formation of the electron blocking layer, the emission layer, and the hole blocking layer.

Evaluation Example 2: Evaluation of Organic Light-Emitting Device

The driving voltages (V), current efficiencies, and lifespans ($LT_{50}$) of the organic light-emitting devices manufactured in Example 1 and Comparative Examples 1 to 3 were measured by using Keithley source-measure unit (SMU) 236 and a luminance meter PR650. The results thereof are shown in Table 2. Here, the lifespan indicates time for the initial luminance to reduce by 50%.

TABLE 2

| | Electron blocking layer | Emission layer Dopant | Host | Hole blocking layer | Driving voltage (V) | Current efficiency (Cd/A) | $LT_{50}$ (hrs) |
|---|---|---|---|---|---|---|---|
| Example 1 | Compound 1 | Compound T1 | CBP | Compound 21 | 3.8 | 12 | 30 |
| Comparative Example 1 | Compound 1 | Compound T1 | CBP | CBP | 3.8 | 6 | 12 |
| Comparative Example 2 | Compound A | Compound T1 | CBP | Compound 21 | 3.8 | 7 | 25 |
| Comparative Example 3 | Compound 1 | Compound T1 | CBP | Compound B | 4.2 | 9 | 27 |

Referring to the results of Table 2, it was found that the organic light-emitting device of Example 1 had high efficiency and long lifespan, as compared with the organic light-emitting devices of Comparative Examples 1 to 3.

The invention claimed is:

1. An organic light-emitting device comprising:
an anode;
a cathode;
an organic layer between the anode and the cathode, the organic layer comprising an emission layer;
an electron blocking layer between the anode and the emission layer, the electron blocking layer being in direct contact with the emission layer; and
a hole blocking layer between the cathode and the emission layer, the hole blocking layer being in direct contact with the emission layer,
wherein the emission layer comprises a host and a dopant,
the electron blocking layer comprises an electron blocking material comprising a compound represented by Formula 1,
the hole blocking layer comprises a hole blocking material, and
the host, the dopant, the electron blocking material, and the hole blocking material each satisfy Equations 1-1 to 1-4:

$T1(EB) \geq T1(H)$         Equation 1-1

$T1(EB) \geq T1(D)$         Equation 1-2

$T1(HB) > T1(H)$         Equation 1-3

$T1(HB) > T1(D)$, and         Equation 1-4 wherein, in Equations 1-1 and 1-4,
T1(EB) indicates a lowest excited triplet energy level of the electron blocking material,
T1(HB) indicates a lowest excited triplet energy level of the hole blocking material,
T1(H) indicates a lowest excited triplet energy level of the host, and
T1(D) indicates a lowest excited triplet energy level of the dopant,

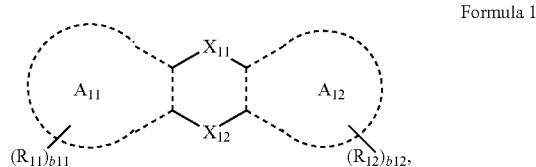

Formula 1 wherein, in Formula 1,
$X_{11}$ is selected from O, S, $N(R_{13})$, and $C(R_{13})(R_{14})$,
$X_{12}$ is selected from a single bond, O, S, $N(R_{15})$, and $C(R_{15})(R_{16})$.
$A_{11}$ and $A_{12}$ are each independently selected from a $C_5$-$C_{60}$ carbocyclic group and a $C_1$-$C_{60}$ heterocyclic group,
$R_{11}$ to $R_{16}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group. - $Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —(=S)$(Q_1)(Q_2)$,
provided that $R_{11}$ and $R_{12}$ are not substituted with an amine group, and
$b_{11}$ and $b_{12}$ are each independently selected from 1, 2, 3, 4, 5, and 6, and
wherein $Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non- aromatic condensed polycyclic group, a monovalent non-aromatic condensed heteropolycyclic group, a biphenyl group, and a terphenyl group.

2. The organic light-emitting device of claim 1, wherein the host, the dopant, the electron blocking material, and the hole blocking material each satisfy Equations 1-11, 1-21, 1-31, and/or 1-41:

1.0 eV≥T1(EB)−T1(H)≥0.01 eV    Equation 1-11

1.0 eV≥T1(EB)−T1(D)≥0.01 eV    Equation 1-21

1.0 eV≥T1(HB)−T1(H)≥0.01 eV    Equation 1-31

1.0 eV≥T1(HB)−T1(D)≥0.01 eV, and    Equation 1-41 wherein, in Equations 1-11, 1-21, 1-31, and 1-41,
T1(EB) indicates a lowest excited triplet energy level of the electron blocking material,
T1(HB) indicates a lowest excited triplet energy level of the hole blocking material,
T1(H) indicates a lowest excited triplet energy level of the host, and
T1(D) indicates a lowest excited triplet energy level of the dopant.

3. The organic light-emitting device of claim 1, wherein a thickness ($D_E$) of the emission layer is greater than or equal to a thickness ($D_{EB}$) of the electron blocking layer.

4. The organic light-emitting device of claim 1, wherein a thickness of the electron blocking layer is in a range of about 50 Angstroms (Å) to about 200 Å.

5. The organic light-emitting device of claim 1, wherein the hole blocking material comprises a compound represented by Formula 2:

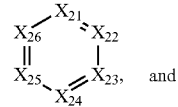

Formula 2 and wherein, in Formula 2,
$X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, and $X_{26}$ is N or $C(R_{26})$, provided that at least one of $X_{21}$ to $X_{26}$ is N,
$R_{21}$ to $R_{26}$ are each independently selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and
at least one of $R_{21}$ to $R_{26}$ is selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

6. The organic light-emitting device of claim 1, wherein a thickness ($D_E$) of the emission layer is greater than or equal to a thickness ($D_{HB}$) of the hole blocking layer.

7. The organic light-emitting device of claim 1, wherein a thickness of the hole blocking layer is in a range of about 50 Å to about 200 Å.

8. An organic light-emitting device comprising:
an anode;
a cathode;

an organic layer between the anode and the cathode, the organic layer comprising an emission layer;
an electron blocking layer between the anode and the emission layer, the electron blocking layer being in direct contact with the emission layer; and
a hole blocking layer between the cathode and the emission layer, the hole blocking layer being in direct contact with the emission layer,
wherein the emission layer comprises a host and a dopant,
the electron blocking layer comprises an electron blocking material,
the hole blocking layer comprises a hole blocking material, and
the host, the dopant, the electron blocking material, and the hole blocking material each satisfy Equations 1-1 to 1-4:

$$T1(EB) \geq T1(H) \quad \text{Equation 1-1}$$

$$T1(EB) \geq T1(D) \quad \text{Equation 1-2}$$

$$T1(HB) > T1(H) \quad \text{Equation 1-3}$$

$$T1(HB) > T1(D), \text{ and} \quad \text{Equation 1-4}$$

wherein, in Equations 1-1 and 1-4,
$T1(EB)$ indicates a lowest excited triplet energy level of the electron blocking material,
$T1(HB)$ indicates a lowest excited triplet energy level of the hole blocking material,
$T1(H)$ indicates a lowest excited triplet energy level of the host, and
$T1(D)$ indicates a lowest excited triplet energy level of the dopant,
wherein the host comprises a compound represented by one of Formulae 1 and 2:

Formula 1

Formula 2 and
wherein, in Formulae 1 and 2,
$X_{11}$ is selected from O, S, $N(R_{13})$, and $C(R_{13})(R_{14})$,
$X_{12}$ is selected from a single bond, O, S, $N(R_{15})$, and $C(R_{15})(R_{16})$,
provided that $X_{11}$ and $X_{12}$ are not respectively $C(R_{13})(R_{14})$ and $C(R_{15})(R_{16})$ at the same time,
$A_{11}$ and $A_{12}$ are each independently selected from a $C_5$-$C_{60}$ carbocyclic group and a $C_1$-$C_{60}$ heterocyclic group,
$R_{11}$ to $R_{16}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —B(Q$_1$)(Q$_2$), —N(Q$_1$)(Q$_2$), —P(Q$_1$)(Q$_2$), —C(=O) (Q$_1$), —S(=O)(Q$_1$), —S(=O)$_2$(Q$_1$), —P(=O)(Q$_1$) (Q$_2$), and —P(=S)(Q$_1$)(Q$_2$),
$b11$ and $b12$ are each independently selected from 1, 2, 3, 4, 5, and 6,
$Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group,
$X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, and $X_{26}$ is N or $C(R_{26})$, provided that at least one of $X_{21}$ to $X_{26}$ is N,
$R_{21}$ to $R_{26}$ are each independently selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and
at least one of $R_{21}$ to $R_{26}$ is selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

9. The organic light-emitting device of claim 1, wherein the host comprises a first host and a second host.

10. The organic light-emitting device of claim 9, wherein the first host is a hole transporting host not comprising an electron transporting moiety, and the second host is an electron transporting host comprising an electron transporting moiety.

11. An organic light-emitting device comprising:
an anode;
a cathode;
an organic layer between the anode and the cathode, the organic layer comprising an emission layer;
an electron blocking layer between the anode and the emission layer, the electron blocking layer being in direct contact with the emission layer; and
a hole blocking layer between the cathode and the emission layer, the hole blocking layer being in direct contact with the emission layer, wherein the emission layer comprises a first host, a second host, and a dopant, the electron blocking layer comprises an electron blocking material, the hole blocking layer comprises a hole blocking material, and the host, the dopant, the electron blocking material, and the hole blocking material each satisfy Equations 1-1 to 1-4:

$$T1(EB) \geq T1(H) \qquad \text{Equation 1-1}$$

$$T1(EB) \geq T1(D) \qquad \text{Equation 1-2}$$

$$T1(HB) > T1(H) \qquad \text{Equation 1-3}$$

$$T1(HB) > T1(D), \text{ and} \qquad \text{Equation 1-4}$$

wherein, in Equations 1-1 and 1-4,

T1(EB) indicates a lowest excited triplet energy level of the electron blocking material, T1(HB) indicates a lowest excited triplet energy level of the hole blocking material, T1(H) indicates a lowest excited triplet energy level of the host, and T1(D) indicates a lowest excited triplet energy level of the dopant, wherein the first host comprises a compound represented by Formula 1, and the second host comprises a compound represented by Formula 2:

Formula 1

Formula 2 and wherein, in Formulae 1 and 2, $X_{11}$ is selected from O, S, $N(R_{13})$, and $C(R_{13})(R_{14})$, $X_{12}$ is selected from a single bond, O, S, $N(R_{15})$, and $C(R_{15})(R_{16})$, $A_{11}$ and $A_{12}$ are each independently selected from a $C_5$-$C_{60}$ carbocyclic group and a $C_1$-$C_{60}$ heterocyclic group, $R_{11}$ to $R_{16}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b11 and b12 are each independently selected from 1, 2, 3, 4, 5, and 6, $Q_1$ to $Q_3$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, $X_{21}$ is N or $C(R_{21})$, $X_{22}$ is N or $C(R_{22})$, $X_{23}$ is N or $C(R_{23})$, $X_{24}$ is N or $C(R_{24})$, $X_{25}$ is N or $C(R_{25})$, and $X_{26}$ is N or $C(R_{26})$, provided that at least one of $X_{21}$ to $X_{26}$ is N, $R_{21}$ to $R_{26}$ are each independently selected from hydrogen, deuterium, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and at least one of $R_{21}$ to $R_{26}$ is selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

12. The organic light-emitting device of claim 11, wherein the first host is identical in material to the electron blocking material.

13. The organic light-emitting device of claim 11, wherein the second host is identical in material to the hole blocking material.

14. The organic light-emitting device of claim 1, wherein the dopant is to emit delayed fluorescence and/or fluorescence.

15. The organic light-emitting device of claim 1, wherein the dopant further satisfies Equation 3:

$$|S1(D) - T1(D)| \leq 0.5 \text{ eV}, \qquad \text{Equation 3}$$

wherein, in Equation 3,

T1(D) indicates a lowest excited triplet energy level of the dopant, and

S1(D) indicates a lowest excited singlet energy level of the dopant.

16. The organic light-emitting device of claim 1, wherein the dopant further satisfies Equation 4 and/or Equation 5:

$$2.65 \text{ eV} \leq S1(D) \leq 2.85 \text{ eV} \qquad \text{Equation 4}$$

$$2.65 \text{ eV} \leq T1(D) \leq 3.05 \text{ eV}, \qquad \text{Equation 5}$$

wherein, in Equations 4 and 5,
T1(D) indicates a lowest excited triplet energy level of the dopant, and
S1(D) indicates a lowest excited singlet energy level of the dopant.

17. The organic light-emitting device of claim 1, wherein
the organic layer comprises a hole transport layer between the anode and the electron blocking layer,
the hole transport layer comprises a hole transporting material, and
the host and the hole transporting material each satisfy Equation 6:

$$T1(H) \geq T1(HT), \text{ and} \qquad \text{Equation 6}$$

wherein, in Equation 6,
T1(H) indicates a lowest excited triplet energy level of the host, and
T1(HT) indicates a lowest excited triplet energy level of the hole transporting material.

18. The organic light-emitting device of claim 1, wherein
the organic layer comprises an electron transport layer between the cathode and the hole blocking layer,
the electron transport layer comprises an electron transporting material,
the dopant and the electron transporting material each satisfy Equation 7:

$$T1(D) \geq T1(ET), \text{ and} \qquad \text{Equation 7}$$

wherein, in Equation 7,
T1(D) indicates a lowest excited triplet energy level of the dopant, and
T1(ET) indicates a lowest excited triplet energy level of the electron transporting material.

* * * * *